United States Patent
Zhang et al.

(10) Patent No.: US 12,322,677 B1
(45) Date of Patent: Jun. 3, 2025

(54) FLUID CHANNEL GEOMETRY OPTIMIZATIONS TO IMPROVE COOLING EFFICIENCY

(71) Applicant: Adeia Semiconductor Bonding Technologies Inc., San Jose, CA (US)

(72) Inventors: Ron Zhang, Sunnyvale, CA (US); Gaius Gillman Fountain, Jr., Youngsville, NC (US); Belgacem Haba, Saratoga, CA (US); Kyong-Mo Bang, Fremont, CA (US); Laura Wills Mirkarimi, Sunol, CA (US); Suhail Jaan Sadiq, Dublin, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/784,639

(22) Filed: Jul. 25, 2024

Related U.S. Application Data

(60) Provisional application No. 63/575,071, filed on Apr. 5, 2024, provisional application No. 63/550,798, filed on Feb. 7, 2024.

(51) Int. Cl.
*H01L 23/46* (2006.01)
*H01L 23/00* (2006.01)
(Continued)

(52) U.S. Cl.
CPC ............ *H01L 23/46* (2013.01); *H01L 23/053* (2013.01); *H01L 23/24* (2013.01); *H01L 24/08* (2013.01);
(Continued)

(58) Field of Classification Search
CPC ....... H01L 23/46; H01L 23/053; H01L 23/24; H01L 25/0655; H01L 2224/08225
See application file for complete search history.

(56) References Cited

U.S. PATENT DOCUMENTS

| 4,274,479 A | 6/1981 | Eastman |
| 5,309,986 A | 5/1994 | Itoh |

(Continued)

FOREIGN PATENT DOCUMENTS

| CN | 109524373 A | 3/2019 |
| CN | 111128976 A | 5/2020 |

(Continued)

OTHER PUBLICATIONS

Evan G. Colgan, "A Practical Implementation of Silicon Microchannel Coolers", available online at <https://www.electronics-cooling.com/2007/11/a-practical-implementation-of-silicon-microchannel-coolers/>, Nov. 1, 2007, 10 pages.

(Continued)

*Primary Examiner* — Zandra V Smith
*Assistant Examiner* — Corbyn D Mellinger
(74) *Attorney, Agent, or Firm* — Haley Guiliano LLP

(57) ABSTRACT

Embodiments herein provide for fluidic cooling assemblies embedded within a device package and related manufacturing methods. In one embodiment, the integrated cooling assembly includes a semiconductor device and a cold plate attached to the semiconductor device. The cold plate has a perimeter sidewall, a top portion and pairs of opposing cavity sidewalls. The perimeter sidewall extends downwardly from the top portion to a backside of the semiconductor device to define a perimeter of the cold plate. Each pair of opposing cavity sidewalls extends downwardly from the top portion towards the backside of the semiconductor device to define a coolant chamber volume therebetween. A distance between each pair of opposing cavity sidewalls in a direction parallel with the backside of the semiconductor device defines a width of a corresponding coolant chamber volume and a spacing between adjacent coolant chamber volumes, wherein the ratio of width to spacing is about 1:1.

20 Claims, 19 Drawing Sheets

(51) Int. Cl.
*H01L 23/053* (2006.01)
*H01L 23/24* (2006.01)
*H01L 25/065* (2023.01)
*H01L 21/48* (2006.01)

(52) U.S. Cl.
CPC .......... *H01L 24/80* (2013.01); *H01L 25/0655* (2013.01); *H01L 21/4803* (2013.01); *H01L 2224/08225* (2013.01); *H01L 2224/80896* (2013.01)

(56) References Cited

U.S. PATENT DOCUMENTS

| | | | |
|---|---|---|---|
| 5,522,452 | A | 6/1996 | Mizuno et al. |
| 5,769,154 | A | 6/1998 | Adkins et al. |
| 6,056,044 | A | 5/2000 | Benson et al. |
| 6,351,384 | B1 | 2/2002 | Daikoku et al. |
| 6,686,532 | B1 | 2/2004 | Macris |
| 6,822,326 | B2 | 11/2004 | Enquist et al. |
| 7,289,326 | B2 | 10/2007 | Heydari et al. |
| 7,485,957 | B2 | 2/2009 | Brandenburg et al. |
| 7,511,372 | B2 | 3/2009 | Chiu |
| 7,523,617 | B2 | 4/2009 | Venkatasubramanian et al. |
| 7,622,324 | B2 | 11/2009 | Enquist et al. |
| 7,692,926 | B2 | 4/2010 | Henderson et al. |
| 7,957,137 | B2 | 6/2011 | Prasher |
| 7,978,473 | B2 | 7/2011 | Campbell et al. |
| 7,997,087 | B2 | 8/2011 | Venkatasubramanian et al. |
| 8,164,169 | B2 | 4/2012 | Chrysler et al. |
| 8,630,091 | B2 | 1/2014 | Ward et al. |
| 9,224,673 | B2 | 12/2015 | Chen et al. |
| 9,299,641 | B2 | 3/2016 | Sekar et al. |
| 9,355,932 | B2 | 5/2016 | Ankireddi et al. |
| 9,391,143 | B2 | 7/2016 | Tong et al. |
| 9,553,071 | B1 | 1/2017 | Haba |
| 9,741,638 | B2 | 8/2017 | Hsieh et al. |
| 9,741,696 | B2 | 8/2017 | Katkar et al. |
| 9,746,248 | B2 | 8/2017 | Semenov et al. |
| 9,768,149 | B2 | 9/2017 | Vadhavkar et al. |
| 9,818,723 | B2 | 11/2017 | Haba |
| 10,032,695 | B2 | 7/2018 | Iyengar et al. |
| 10,083,934 | B2 | 9/2018 | Haba |
| 10,157,818 | B2 | 12/2018 | Chen et al. |
| 10,170,392 | B2 | 1/2019 | Chainer et al. |
| 10,199,356 | B2 | 2/2019 | Kinsley |
| 10,312,221 | B1 | 6/2019 | Agarwal et al. |
| 10,332,823 | B2 | 6/2019 | Chen et al. |
| 10,461,059 | B2 | 10/2019 | Koopmans et al. |
| 10,694,641 | B2 | 6/2020 | Basu et al. |
| 10,978,427 | B2 | 4/2021 | Li et al. |
| 11,187,469 | B2 | 11/2021 | Karesh |
| 11,387,164 | B2 | 7/2022 | Wu et al. |
| 11,598,594 | B2 | 3/2023 | Lewis et al. |
| 11,996,351 | B2 | 5/2024 | Hsiao et al. |
| 2003/0157782 | A1 | 8/2003 | Kellar et al. |
| 2004/0184237 | A1 | 9/2004 | Chang |
| 2004/0251530 | A1 | 12/2004 | Yamaji |
| 2005/0126766 | A1 | 6/2005 | Lee et al. |
| 2005/0213301 | A1 | 9/2005 | Prasher |
| 2006/0042825 | A1 | 3/2006 | Lu et al. |
| 2006/0103011 | A1 | 5/2006 | Andry et al. |
| 2007/0025082 | A1 | 2/2007 | Lee et al. |
| 2007/0107875 | A1 | 5/2007 | Lee et al. |
| 2008/0096320 | A1 | 4/2008 | Farrar |
| 2009/0122491 | A1 | 5/2009 | Martin et al. |
| 2010/0116534 | A1 | 5/2010 | Choi et al. |
| 2010/0230805 | A1 | 9/2010 | Refai-Ahmed |
| 2010/0300202 | A1 | 12/2010 | Joyce |
| 2011/0129986 | A1 | 6/2011 | Libralesso et al. |
| 2011/0205707 | A1* | 8/2011 | Kharazmi ............ H01L 23/473 361/699 |
| 2013/0044431 | A1 | 2/2013 | Koeneman |
| 2013/0050944 | A1 | 2/2013 | Shepard |
| 2013/0087904 | A1 | 4/2013 | Clark et al. |
| 2014/0126150 | A1 | 5/2014 | Song et al. |
| 2015/0194363 | A1 | 7/2015 | Jun et al. |
| 2016/0276314 | A1 | 9/2016 | Ching et al. |
| 2017/0012016 | A1 | 1/2017 | Joshi et al. |
| 2017/0092565 | A1 | 3/2017 | Chen et al. |
| 2017/0103937 | A1 | 4/2017 | Hsieh et al. |
| 2018/0053730 | A1 | 2/2018 | Shao et al. |
| 2018/0087842 | A1 | 3/2018 | Chainer et al. |
| 2018/0090427 | A1 | 3/2018 | Bernstein et al. |
| 2018/0160565 | A1 | 6/2018 | Parida |
| 2018/0211900 | A1 | 7/2018 | Gutala et al. |
| 2018/0308783 | A1 | 10/2018 | Refai-Ahmed et al. |
| 2019/0008071 | A1 | 1/2019 | Kim |
| 2019/0355706 | A1 | 11/2019 | Enquist et al. |
| 2019/0385928 | A1 | 12/2019 | Leobandung |
| 2020/0035583 | A1 | 1/2020 | Beauchemin et al. |
| 2020/0105639 | A1 | 4/2020 | Valavala et al. |
| 2020/0312742 | A1 | 10/2020 | Lofgreen et al. |
| 2020/0343160 | A1 | 10/2020 | Mizerak et al. |
| 2020/0350233 | A1 | 11/2020 | Mizerak et al. |
| 2020/0352053 | A1 | 11/2020 | Mizerak et al. |
| 2020/0395313 | A1 | 12/2020 | Mallik et al. |
| 2021/0066164 | A1 | 3/2021 | Wu et al. |
| 2021/0175143 | A1 | 6/2021 | Yu et al. |
| 2021/0183741 | A1 | 6/2021 | Jha et al. |
| 2021/0193548 | A1 | 6/2021 | Wan et al. |
| 2021/0193620 | A1 | 6/2021 | Refai-Ahmed et al. |
| 2021/0280497 | A1 | 9/2021 | Brun et al. |
| 2021/0288037 | A1 | 9/2021 | Tao et al. |
| 2021/0378106 | A1 | 12/2021 | Iyengar et al. |
| 2021/0378139 | A1 | 12/2021 | Rice et al. |
| 2021/0407888 | A1* | 12/2021 | Elsherbini ............ H01L 23/467 |
| 2021/0410329 | A1 | 12/2021 | Yang et al. |
| 2022/0037231 | A1 | 2/2022 | Hsiao et al. |
| 2022/0087059 | A1 | 3/2022 | Sathyamurthy et al. |
| 2022/0117115 | A1 | 4/2022 | Malouin et al. |
| 2022/0130734 | A1 | 4/2022 | Chiu et al. |
| 2022/0189850 | A1 | 6/2022 | Liff et al. |
| 2022/0210949 | A1 | 6/2022 | Edmunds et al. |
| 2022/0230937 | A1 | 7/2022 | Malouin et al. |
| 2022/0408592 | A1 | 12/2022 | Malouin et al. |
| 2023/0048500 | A1 | 2/2023 | Malouin et al. |
| 2023/0154828 | A1 | 5/2023 | Haba et al. |
| 2023/0156959 | A1 | 5/2023 | Malouin et al. |
| 2023/0207474 | A1 | 6/2023 | Uzoh et al. |
| 2023/0245950 | A1 | 8/2023 | Haba et al. |
| 2023/0284421 | A1 | 9/2023 | Malouin et al. |
| 2023/0298969 | A1* | 9/2023 | Park ............... H01L 23/433 257/712 |
| 2024/0038633 | A1 | 2/2024 | Haba et al. |
| 2024/0130077 | A1* | 4/2024 | Nie ............... H01L 23/473 |
| 2024/0203821 | A1* | 6/2024 | Kang ............... H01L 23/427 |
| 2024/0203823 | A1 | 6/2024 | Uzoh et al. |
| 2024/0222222 | A1 | 7/2024 | Haba et al. |
| 2024/0222226 | A1 | 7/2024 | Haba |
| 2024/0249995 | A1 | 7/2024 | Haba |
| 2024/0249998 | A1 | 7/2024 | Gao et al. |
| 2024/0266255 | A1 | 8/2024 | Haba et al. |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2022-0033979 * | 3/2022 |
| KR | 10-2023-0136509 A | 9/2023 |
| TW | 200834871 A | 8/2008 |
| WO | 2013/097146 A1 | 7/2013 |

OTHER PUBLICATIONS

Francisco Pires, "Tsmc Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.

(56) References Cited

OTHER PUBLICATIONS

IBM, "Functional electronic packaging-Thermal management roadmap", available online at <https://web.archive.org/web/20170220095511/https://www.zurich.ibm.com/st/electronicpackaging/cooling.html>, Feb. 20, 2017, 7 pages.

International Search Report and Written Opinion received for PCT Patent Application No. PCT/US23/28942, mailed on Nov. 16, 2023, 12 pages.

International Search Report and Written Opinion received for PCT Patent Application No. PCT/US23/84874, mailed on Apr. 22, 2024, 7 pages.

International Search Report and Written Opinion received for PCT Patent Application No. PCT/US23/85801, mailed on Apr. 26, 2024, 8 pages.

International Search Report and Written Opinion received for PCT Patent Application No. PCT/US23/85816, mailed on Apr. 23, 2024, 11 pages.

International Search Report and Written Opinion received for PCT Patent Application No. PCT/US23/86233, mailed on Apr. 26, 2024, 7 pages.

Kaplan, F. et al., "LoCool: Fighting Hot Spots Locally for System Energy Efficiency" IEEE Transactions on Computer-Aided Design of Intergrated Circuits and Systems, 39(4):895-908 (2020).

U.S. Appl. No. 18/129,567, filed Mar. 31, 2023, First Name Inventor: Cyprian Emeka Uzoh, "Embedded Cooling Systems for Device Packages and Methods of Cooling Packaged Devices".

PCT Application No. PCT/US2024/022253, International Search Report and Written Opinion dated Jul. 17, 2024, 14 pages.

Shamsa, M., et al., "Thermal conductivity of diamond-like carbon films", Applied Physics Letters, vol. 89, No. 16, Oct. 20, 2006, pp. 161921-161921-3.

Wu, C. J., et al., "Ultra High Power Cooling Solution for 3D-Ics", 2021 Symposium on VLSI Technology, Jun. 2021, 2 pages.

"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.

"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.

"Microconvective Liquid Cooling for high power electronics," https://jetcool.com/technology/, downloaded Mar. 7, 2024, 6 pages.

Benson D.A. et al., "Micro-Machined Heat Pipes in Silicon MCM Substrates", Sandia National Laboratories, Sandia Report: SAND97-0100-UC-704, printed Jan. 1997, 17 pages.

International Search Report and Written Opinion mailed Jun. 5, 2024, in International Application No. PCT/US2024/013758, 9 pages.

International Search Report and Written Opinion mailed Mar. 16, 2023, in International Application No. PCT/US2022/050105, 9 pages.

International Search Report and Written Opinion mailed May 30, 2023, in International Application No. PCT/US2023/061494, 9 pages.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.

Lien, Y-J, et al., "An Energy-efficient Si-integrated Micro-cooler for High Power and Power-density Computing Applications," 74th Electronic Components and Technology Conference, 2024, pp. 1025-1029.

Walsh, Stephen Michael, "Microjet Impingement Cooling of High Power-Density Electronics," Thesis, submitted May 11, 2018, 93 pages.

* cited by examiner

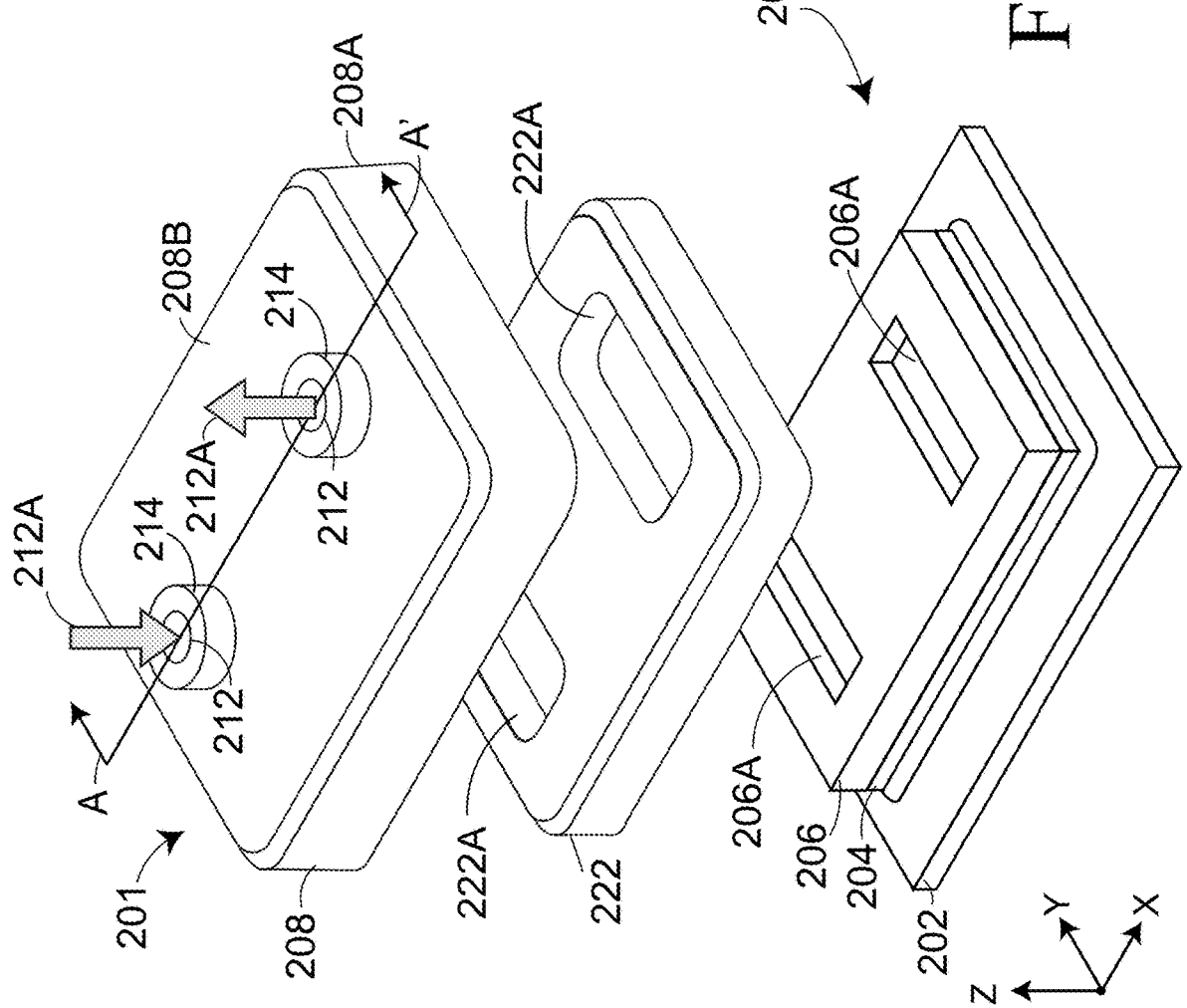

FLUID CHANNEL GEOMETRY OPTIMIZATIONS TO IMPROVE COOLING EFFICIENCY

CROSS-REFERENCE TO RELATED APPLICATIONS

This application claims the benefit of U.S. Provisional Patent Application No. 63/550,798, filed Feb. 7, 2024, and U.S. Provisional Patent Application No. 63/575,071, filed Apr. 5, 2024, both of which are incorporated by reference herein in their entireties.

FIELD

The present disclosure relates to advanced packaging for microelectronic devices, and in particular, cooling systems for device packages and methods of manufacturing the same.

BACKGROUND

Energy consumption poses a critical challenge for the future of large-scale computing as the world's computing energy requirements are rising at a rate that most would consider unsustainable. Some models predict that the information, communication and technology (ICT) ecosystem could exceed 20% of global electricity use by 2030, with direct electrical consumption by large-scale computing centers accounting for more than one-third of that energy usage. A significant portion of the energy used by such large-scale computing centers is devoted to cooling, since even small increases in operating temperatures can negatively impact the performance of microprocessors, memory devices, and other electronic components. While some of this energy is expended to operate the cooling systems that are directly cooling the chips (e.g., heat spreaders, heat pipes, etc.), energy consumption/costs for indirect cooling can also be quite staggering. Indirect cooling energy costs include, for example, cooling or air conditioning of data center buildings. Data center buildings can house thousands, to tens of thousands or more, of high performance chips in server racks, and each of those high performance chips is a heat source. An uncontrolled ambient temperature in a data center will adversely affect the performance of the individual chips, and the data center system performance as a whole.

Thermal dissipation in high-power density chips (semiconductor devices/die) is also a critical challenge as improvements in chip performance, e.g., through increased gate or transistor density due to advanced processing nodes, evolution of multi-core microprocessors, etc., have resulted in increased power density and a corresponding increase in thermal flux that contributes to elevated chip temperatures. Higher density of transistors also increases the length of metal wiring on the chips, which generates its own additional thermal flux due to Joule heating of these wires due to higher currents. These elevated temperatures are undesirable as they can degrade the chip's operating performance, efficiency, reliability, and amount of remaining life. Cooling systems used to maintain the chip at a desired operating temperature typically remove heat using one or more heat dissipation devices, e.g., thermal spreaders, heat pipes, cold plates, liquid cooled heat pipe systems, thermal-electric coolers, heat sinks, etc. One or more thermal interface material(s), such as, for example, thermal paste, thermal adhesive, or thermal gap filler, may be used to facilitate heat transfer between the surfaces of a chip and heat dissipation device(s). A thermal interface material(s) (TIM(s)) is any material that is inserted between two components to enhance the thermal coupling therebetween. Unfortunately, the combined thermal resistance of (i) the thermal resistance of interfacial boundary regions between a TIM(s) and the chip and/or the heat dissipation device(s), and (ii) the thermal resistance of a thermal interface material(s) itself can inhibit heat transfer from the chip to the heat dissipation devices, undesirably reducing the cooling efficiency of the cooling system.

Generally speaking, there are multiple components between the heat dissipating sources (i.e., active circuitry) in the chips and the heat dissipation devices, each of which contributes to the system thermal resistance cumulatively along the heat transfer paths and raises chip junction temperatures from the ambient.

Such cooling systems can suffer from reduced cooling efficiency due to the design and manufacture of system components.

Accordingly, there exists a need in the art for improved energy-efficient cooling systems, by reducing system thermal resistance, and methods of manufacturing the same.

SUMMARY

Embodiments herein provide integrated cooling assemblies embedded in advanced device packages. Advantageously, the integrated device cooling assemblies deliver appropriate cooling directly to a semiconductor device to obtain effective cooling of the device.

A first general aspect includes a device package having an integrated cooling assembly comprising a semiconductor device and a cold plate attached to the semiconductor device, the cold plate having a perimeter sidewall, a top portion with multiple cavities with pairs of opposing cavity sidewalls. The perimeter sidewall extends downwardly from the top portion to a backside of the semiconductor device to define a perimeter of the cold plate, each pair of opposing cavity sidewalls extends downwardly from the top portion towards the backside of the semiconductor device to define a coolant chamber volume therebetween, and a distance between each pair of opposing cavity sidewalls in a direction parallel with the backside of the semiconductor device defines a width W of a corresponding coolant chamber volume and a spacing S between adjacent coolant chamber volumes, wherein the ratio of W to S is about 1:1.

Implementations of the device package according to the first general aspect may include one or more of the following features. In one embodiment, each coolant chamber volume has a triangular cross-section defined by the respective pairs of opposing cavity sidewalls and the backside of the semiconductor device. In some embodiments, the ratio of W to S is about 1:1.05. In some embodiments, the ratio of W to S is about 1:1.1. In some embodiments, the ratio of W to S is about 1:1.2.

A second general aspect includes a method of manufacturing the device package according to the first general aspect. The method comprises directly bonding a first substrate comprising the cold plate of aspects described herein to a second substrate comprising first and second vertically stacked semiconductor devices. The method further comprises singulating an integrated cooling assembly comprising the semiconductor devices and the cold plate from the bonded first and second substrates.

A third general aspect includes an integrated cooling assembly including a semiconductor device and a cold plate attached to the semiconductor device. The cold plate includes a perimeter sidewall, a top portion, pairs of opposing upper cavity sidewalls, and pairs of opposing lower cavity sidewalls. The perimeter sidewall extends downwardly from the top portion to a backside of the semiconductor device to define a perimeter of the cold plate. Each pair of opposing lower cavity sidewalls extends upwardly from the backside of the semiconductor device towards a base surface of the top portion. Each pair of opposing upper cavity sidewalls extends downwardly from the base surface of the top portion to the backside of the semiconductor device, and each pair of opposing lower cavity sidewalls is substantially aligned with a corresponding pair of opposing upper cavity sidewalls in a direction parallel to the backside of the semiconductor device to define a coolant chamber volume therebetween.

Implementations of the device package according to the third general aspect may include one or more of the following features. In some embodiments, a distance between each pair of opposing upper cavity sidewalls in a direction parallel with the backside of the semiconductor device defines a width W of a corresponding coolant chamber volume and a spacing S between adjacent coolant chamber volumes wherein the ratio of W to S is about 1:1. In some embodiments, the coolant chamber volume has a trapezoidal cross-section defined by the respective upper and lower cavity sidewalls, the base surface and the backside of the semiconductor device. In some embodiments, the lower cavity sidewalls are formed in the backside of the semiconductor device.

A fourth general aspect includes a method of manufacturing the device package. The method comprises directly bonding a first substrate and an intermediate substrate to form a cold plate of aspects described herein to a second substrate comprising first and second vertically stacked semiconductor devices. The method further comprises singulating an integrated cooling assembly comprising the semiconductor devices and the cold plate from the bonded first and second substrates.

A fifth general aspect includes a method of manufacturing the device package. The method comprises directly bonding a first substrate and a plurality of intermediate substrates to form a cold plate of aspects described herein to a second substrate comprising first and second vertically stacked semiconductor devices. The method further comprises singulating an integrated cooling assembly comprising the semiconductor devices and the cold plate from the bonded first and second substrates.

BRIEF DESCRIPTION OF THE DRAWINGS

The above and other objects and advantages of the disclosure will be apparent upon consideration of the following detailed description, taken in conjunction with the accompanying drawings, in which:

FIG. 2C is a schematic exploded isometric view of the device package in FIG. 2B;

Figure 1:
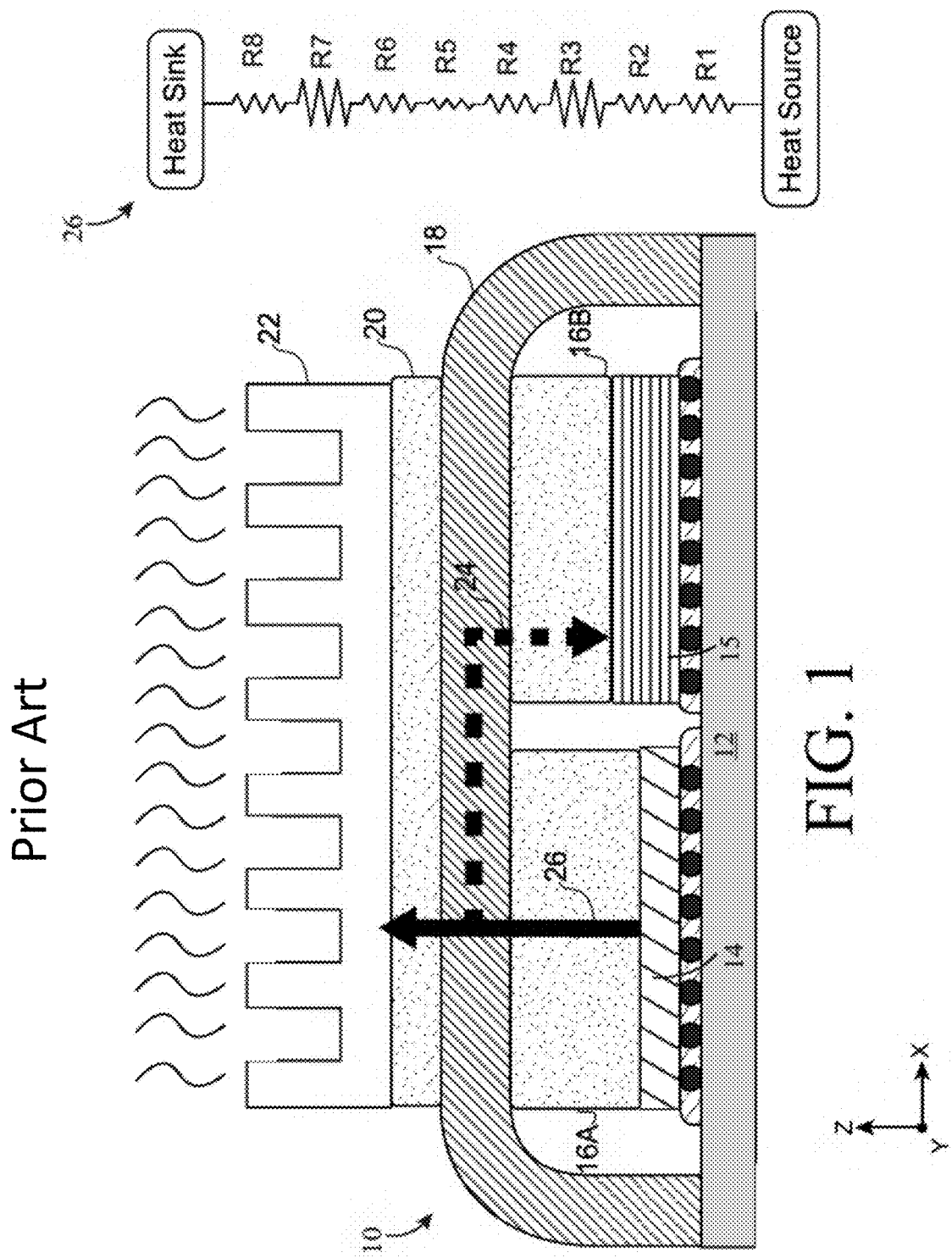
FIG. 1 illustrates a device package with an external heat sink.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed or mounted. The term "substrate" also includes semiconductor substrates that provide a supporting material upon which elements of a semiconductor device are fabricated or attached, and any material layers, features, and/or electronic devices formed thereon, therein, or therethrough. Examples of substrate material that may be used in applications that generate high thermal density include, but are not limited to, Si, GaN, SiC, InP, GaP, InGaN, AlGaInP, AlGaAs, etc.

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that forms the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active sides" and "non-active sides" are also used to describe surfaces of material layers or features formed on, in, or through the semiconductor substrate, whether or not the material layers or features are ultimately present in the fabricated or assembled device. For example, in some instances, the term "active side" is used to indicate a surface of a substrate that will in the future, but does not yet, include semiconductor device elements.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," "top," "bottom" and the like are generally made with reference to the X, Y, and Z directions set forth by X, Y and Z axes in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," and the like, either alone or in combination with a spatially relevant term, include both relationships with intervening elements and direct relationships where there are no intervening elements. Furthermore, the term "horizontal" is generally made with reference to the X-axis direction and the Y-axis direction set forth in the drawings. The term "vertical" is generally made with reference to the Z-axis direction set forth in the drawings.

Various embodiments disclosed herein include bonded structures in which two or more elements are directly bonded to one another without an intervening adhesive (referred to herein as "direct bonding," "direct dielectric bonding," or "directly bonded"). The resultant bonds formed by this technique may be described as "direct bonds" and/or "direct dielectric bonds". In some embodiments, direct bonding includes the bonding of a single material on the first of the two or more elements and a single material on a second one of the two or more elements, where the single material on the different elements may or may not be the same. For example, bonding a layer of one inorganic dielectric (e.g., silicon oxide) to another layer of the same or different inorganic dielectric. As discussed in more detail below, the process of direct bonding (e.g., direct dielectric bonding) provides a reduction of thermal resistance between a semiconductor device and a cold plate. Examples of dielectric materials used in direct bonding include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. Direct bonding can also include bonding of multiple materials on one element to multiple materials on the other element (e.g., hybrid bonding). As used herein, the term "hybrid bonding" refers to a species of direct bonding having both i) at least one (first) nonconductive feature directly bonded to another (second) nonconductive feature, and ii) at least one (first) conductive feature directly bonded to another (second) conductive feature, without any intervening adhesive. The resultant bonds formed by this technique may be described as "hybrid bonds" and/or "direct hybrid bonds". In some hybrid bonding embodiments, there are many first conductive features, each directly bonded to a second conductive feature, without any intervening adhesive. In some embodiments, nonconductive features on the first element are directly bond to nonconductive features of the second element at room temperature without any intervening adhesive, which is followed by bonding of conductive features of the first element directly bonded to conductive features of the second element via annealing at slightly higher temperatures (e.g., >100° C., >200° C., >250° C., >300° C., etc.)

Unless otherwise noted, the terms "cooling assembly" and "integrated cooling assembly" generally refer to a semiconductor device and a cold plate attached to the semiconductor device. Typically, the cold plate is formed with recessed surfaces that define one or more fluid cavities (e.g., coolant chamber volume(s) or coolant channel(s)) between the cold plate and the semiconductor device. In embodiments where the cold plate is formed with plural fluid cavities, each fluid cavity may be defined by cavity dividers and/or sidewalls of the cold plate. For example, cavity dividers may be spaced apart from each other and extend laterally between opposing cold plate sidewalls (e.g., in one direction between a first pair of opposing cold plate sidewalls, or in two directions between orthogonal pairs of opposing cold plate sidewalls). The cavity dividers and the cold plate sidewalls may collectively define adjacent fluid cavities therebetween. The cold plate may comprise a polymer material.

The cold plate may be attached to the semiconductor device by use of a compliant adhesive layer or by direct bonding or hybrid bonding. Direct bonding may include direct dielectric bonding techniques as described herein, and may give rise to direct dielectric bonds. Hybrid bonding may include hybrid bonding techniques as described herein, and may give rise to direct hybrid bonds.

For example, the cold plate may include material layers and/or metal features that facilitate direct bonding or hybrid bonding with the semiconductor device. Beneficially, the backside of the semiconductor device is directly exposed to coolant fluids flowing through the integrated cooling assembly, thus providing for direct heat transfer therebetween. Unless otherwise noted, the integrated cooling assemblies described herein may be used with any desired fluid, e.g., liquid, gas, and/or vapor-phase coolants, such as water, glycol, etc.

Exemplary fluids available for use in the various thermal solution embodiments include: water (either purified or deionized), a glycol (e.g., ethylene glycol, propylene glycol), glycols mixed with water (e.g., ethylene glycol mixed with water (EGW) or propylene glycol mixed with water (PGW)), dielectric fluids (e.g. fluorocarbons, polyalphaolefin (PAO), isoparaffins, synthetic esters, or very high viscosity index (VHVI) oils), or mineral oils. Additionally, depending upon design and operating conditions, these fluids may be used in single-phase liquid, single-phase vapor, two-phase liquid/vapor or two-phase solid/liquid. All of these fluids and fluid mixtures will alter the thermohydraulic and heat transfer properties by altering the temperatures where phase change occurs, as well as meeting design temperature and pressure conditions for the component being cooled or warmed and the thermal solution being deployed. Additionally, multiple combinations of the fluid phases may be employed in various hybrid configurations to meet the particular cooling or warming needs of a respective implementation and still be within the scope of the contemplated embodiments.

Additionally, in some embodiments part or all the cooling is provided by gases. Exemplary gases include atmospheric air and/or one or more inert gases such as nitrogen. Atmospheric air may be taken to mean the mixture of different gases in Earth's atmosphere made up of about 78% nitrogen and 21% oxygen.

Depending on the design needs of a thermal solution system using the disclosed embodiments, engineered dielectric cooling fluids may be used. Some examples of dielectric fluids used for cooling semiconductors include: 3M™ Fluorinert™ Liquid FC-40-A non-flammable, dielectric fluid that can be used in direct contact with live electronics; 3M™ Novec™ Engineered Fluids-A non-flammable, dielectric fluid that can be used in direct contact with live electronics; Galden® PFPE (perfluoropolyether) products used as heat transfer fluids; EnSolv Fluoro HTF-A solvent with a high boiling point and low pour point that can be used for semiconductor wafer cooling. It is understood that in the selection of the cooling fluid, system design aspects such as operating temperatures and pressures, fluid flow rates, fluid viscosity, and other properties will require evaluation when selecting the appropriate cooling fluid.

In some embodiments, the cooling fluids may contain microparticles and/or nanoparticle additives to enhance the conductivity of the cooling fluid within the integrated cooling assemblies. Choi and Eastman (1995) from Argonne National Laboratory, U.S.A. (Yu et al., 2007) coined the word "nanofluid". Nanofluids are engineered fluids prepared by suspending the nano-sized (1-100 nm) particles of metals/non-metals and their oxide(s) with a base/conventional fluid. The suspension of high thermal conductivity metals/non-metals and their oxides nanoparticles enhances the thermal conductivity and heat transfer ability, etc. of the base fluid. The additives to the underlying cooling fluid may comprise for example, nanoparticles of carbon nanotube, nanoparticles of graphene, or nanoparticles of metal oxides. When the cooling fluid contains microparticles, the microparticles are typically 10 microns or less in diameter. Silicon oxide microparticles may be used.

The volume concentration of these micro or nanoparticles may be less than 1%, less than 0.2%, or less than 0.05%. Depending upon the liquid and micro/nanoparticle type chosen for the cooling fluid, higher volume concentrations of 10% or less, 5% or less, or 2% or less may be used. The cooling fluids may also contain small amounts of glycol or glycols (e.g. propylene glycol, ethylene glycol etc.) to reduce frictional shear stress and drag coefficient in the cooling fluid within the integrated cooling assembly. The availability of different base fluids (e.g., water, ethylene glycol, mineral or other stable oils, etc.) and different nanomaterials provide a variety of nanomaterial options for nanofluid solutions to be used in the various embodiments. These nanomaterial option groups such as aforementioned metals (e.g., Cu, Ag, Fe, Au, etc.), metal oxides (e.g., $TiO2$, $Al_2O_3$, CuO, etc.), carbons (e.g. CNTS, graphene, diamond, graphite . . . etc.), or a mixture of different types of nanomaterials. Metal nanoparticles (Cu, Ag, Au . . . ), metal oxide nanoparticles ($Al_2O_3$, $TiO2$, CuO), and carbon-based nanoparticles are commonly employed elements. Silicon oxide nanoparticles may also be used. Using cooling fluids with micro and/or nanoparticles when practicing the various embodiments disclosed herein can result in increased heat removal efficiencies and effectiveness.

The fluid control design aspects of specific embodiments may require the nanofluids to be magnetic to facilitate either movement or cessation of movement of the fluids within the semiconductor structures. Magnetic nanofluids (MNFs) are suspensions of a non-magnetic base fluid and magnetic nanoparticles. Magnetic nanoparticles may be coated with surfactant layers such as oleic acid to reduce particle agglomeration and/or settling. Magnetic nanoparticles used in MNFs are usually made of metal materials (ferromagnetic materials) such as iron, nickel, cobalt, as well as their oxides such as spinel-type ferrites, magnetite (Fe3O4), and so forth. The magnetic nanoparticles used in MNFs typically range in size from about 1 to 100 nanometers (nm).

This disclosure describes embodiments involving the architecture of system and component elements that can be employed to provide for the cooling of semi-conductor components, packaging, and boards. However, those skilled in the art will appreciate the disclosed components and arrangements can be deployed and used in scenarios where component heat up or thermal warm up is desired for a component that is currently outside the low end of the desired operational range. Components that are outside the low end of their operational range can, if started in a cold environment, experience thermal warping or cracking up to and including thermal overexpansion and contact separation that may impair the successful operation of the system. Therefore, in these scenarios, the architectures and embodiments disclosed herein can be used where the indirect thermal solutions supporting them are repurposed or operated in a hybrid configuration to provide warming fluids or heat transfer media to accomplish the warm-up or heat-up scenario. These scenarios are controlled by systems not shown here to bring temperatures up at a speed or timing that enables the materials to avoid the excessive thermal expansion or unequal thermal expansion that may occur among the materials of the semiconductor or packaging being serviced by the thermal solution. Once the component or packaging is brought up into the normal operating range, it can be safely started and brought to a useful operational state.

Considering the warm-up or heat-up embodiments introduced above, the balance of this disclosure and terms used should be viewed in a light that also considers the design option for such warm-up or heat-up. Thus, where terms such as cooling channel, cooling chamber volume, and cooling port are used, for example, such terms could also be considered as a thermal control channel, a thermal control volume, or a thermal control port, respectively. A person of skill would understand that heat flux or heat transfer would go in a different direction, but the design concepts are similar and can be successfully employed in the various embodiments.

In some embodiments, a cooling channel is a liquid cooling channel, and a liquid may flow through the liquid cooling channel. In some embodiments, the liquid may comprise a water and/or glycol (e.g., propylene glycol, ethylene glycol, and mixtures thereof).

As described below, coolant fluid flowing through a cold plate may be used to control the temperature of semiconductor devices. The fluid flowing across the surface of the semiconductor device absorbs heat and conducts heat away from the semiconductor device.

FIG. 1 is a schematic side view of a device package 10 and a heat sink 22 attached to the device package 10. The device package 10 typically includes a package substrate 12, a first device 14, a device stack 15, a heat spreader 18, and first TIM layers 16A, 16B thermally coupling the first device 14 and the device stack 15 to the heat spreader 18. The device package 10 is thermally coupled to the heat sink 22 through a second TIM layer 20. The TIM layers 16A, 16B, 20 facilitate thermal contact between components in the device package 10 and between the device package 10 and the heat sink 22.

As heat flux density increases with increasing power density in advanced semiconductor devices, the cumulative thermal resistance of the system illustrated in FIG. 1 is increasingly problematic as heat cannot be dissipated quickly enough to allow semiconductor devices to run at optimal power. Consequently, the energy efficiency of semiconductor devices is reduced. Furthermore, heat is transferred between semiconductor devices within the device package 10, as shown with heat transfer path 24 (illustrated as a dashed line), where heat may be undesirably transferred from the first device 14 having a high heat flux, such as a central processing unit (CPU) or a graphical processing unit (GPU), to the device stack 15 having low heat flux, such as memory, through the heat spreader 18.

For example, as shown in FIG. 1, each device package component and the respective interfacial boundaries therebetween have a corresponding thermal resistance that forms heat transfer path 26 (illustrated by arrow 26 in FIG. 1). The right-hand side of FIG. 1 illustrates the heat transfer path 26 as a series of thermal resistances R1-R8 between a heat source and a heat sink. Here, R1 is the thermal resistance of the bulk semiconductor material of the first device 14. R3 and R7 are the thermal resistances of the first TIM layers 16A, 16B and the second TIM layer 20, respectively. R5 is the thermal resistance of the heat spreader 18. R2, R4, R6, and R8 represent the thermal resistance at the interfacial region of the components (e.g., contact resistances). In a typical cooling system, R3 and R7 may account for 80% or more of the cumulative thermal resistance of the heat transfer path 26, and R5 may account for 5% or more. R1 of the first device 14 and R2, R4, R6, and R8 of the interfaces account for the remaining cumulative thermal resistance. Accordingly, embodiments described herein provide for integrated cooling assemblies embedded within a device package. The embedded cooling assemblies shorten the thermal resistance path between a semiconductor device and a heat sink and reduce thermal communication between semiconductor devices disposed in the same device package, such as described in relation to the figures below.

Figure 2A:
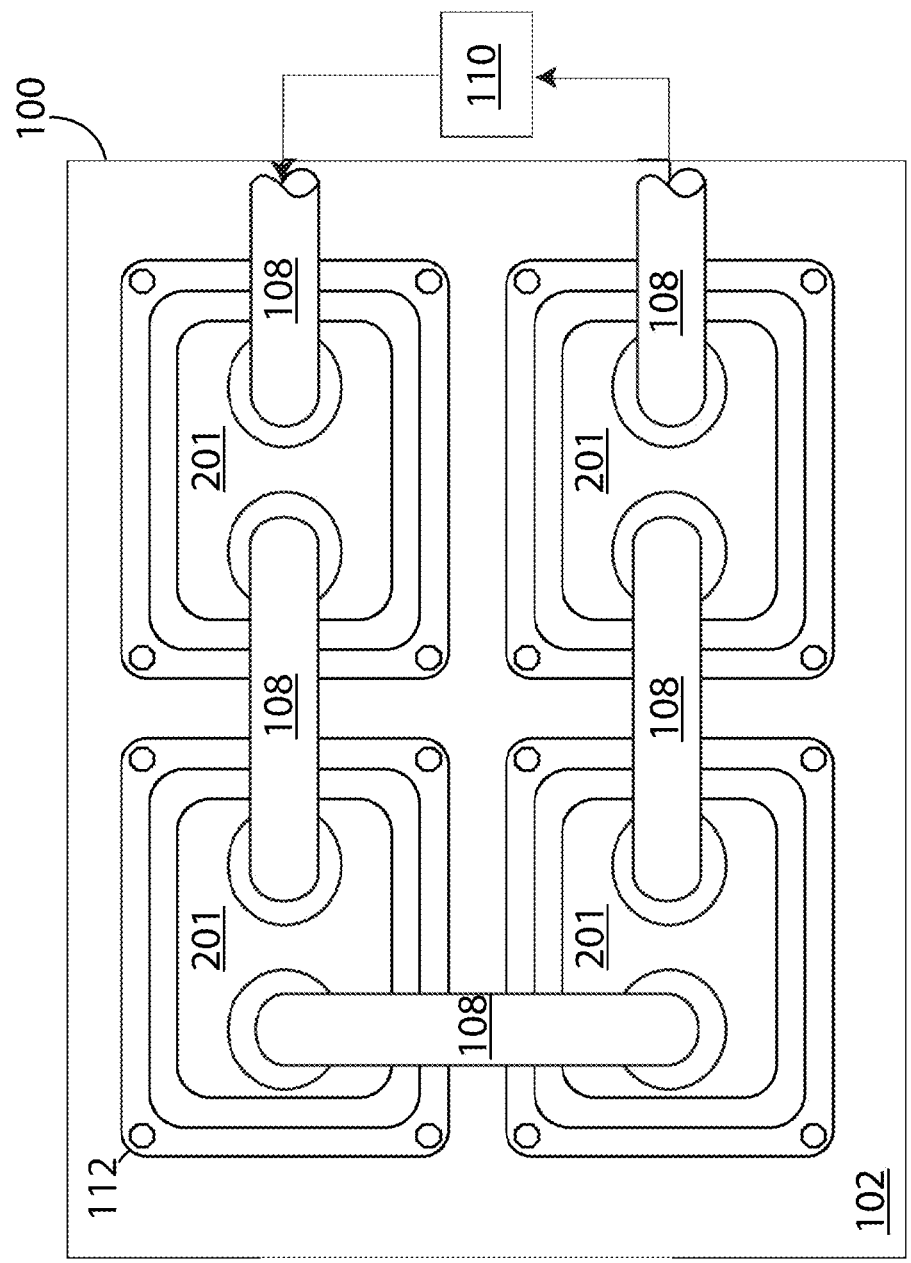
FIG. 2A is a schematic plan view of an example of a system panel, in accordance with embodiments of the present disclosure.

FIG. 2A is a schematic plan view of an example of a system panel 100, in accordance with embodiments of the present disclosure. Generally, the system panel 100 includes a printed circuit board (PCB) 102, a plurality of device packages 201 mounted to the PCB 102, and a plurality of coolant lines 108 fluidly coupling each of the device packages 201 to a coolant source 110. It is contemplated that coolant fluid may be delivered to each of the device packages 201 in any desired fluid phase, e.g., liquid, vapor, gas, or combinations thereof, and may flow out from each device package 201 in the same phase or a different phase. In some embodiments, the coolant fluid is delivered to the device packages 201 and returned therefrom as a liquid, whereby the coolant source 110 may comprise a heat exchanger or chiller to maintain the coolant fluid at a desired temperature. In other embodiments, the coolant fluid may be delivered to the device packages 201 as a liquid, vaporized to a vapor within the device packages 201, and returned to the coolant source 110 as a vapor. In those embodiments, the device packages 201 may be fluidly coupled to the coolant source 110 in parallel, and the coolant source 110 may include or further include a compressor (not shown) for condensing the received vapor to a liquid form.

Figure 2B:
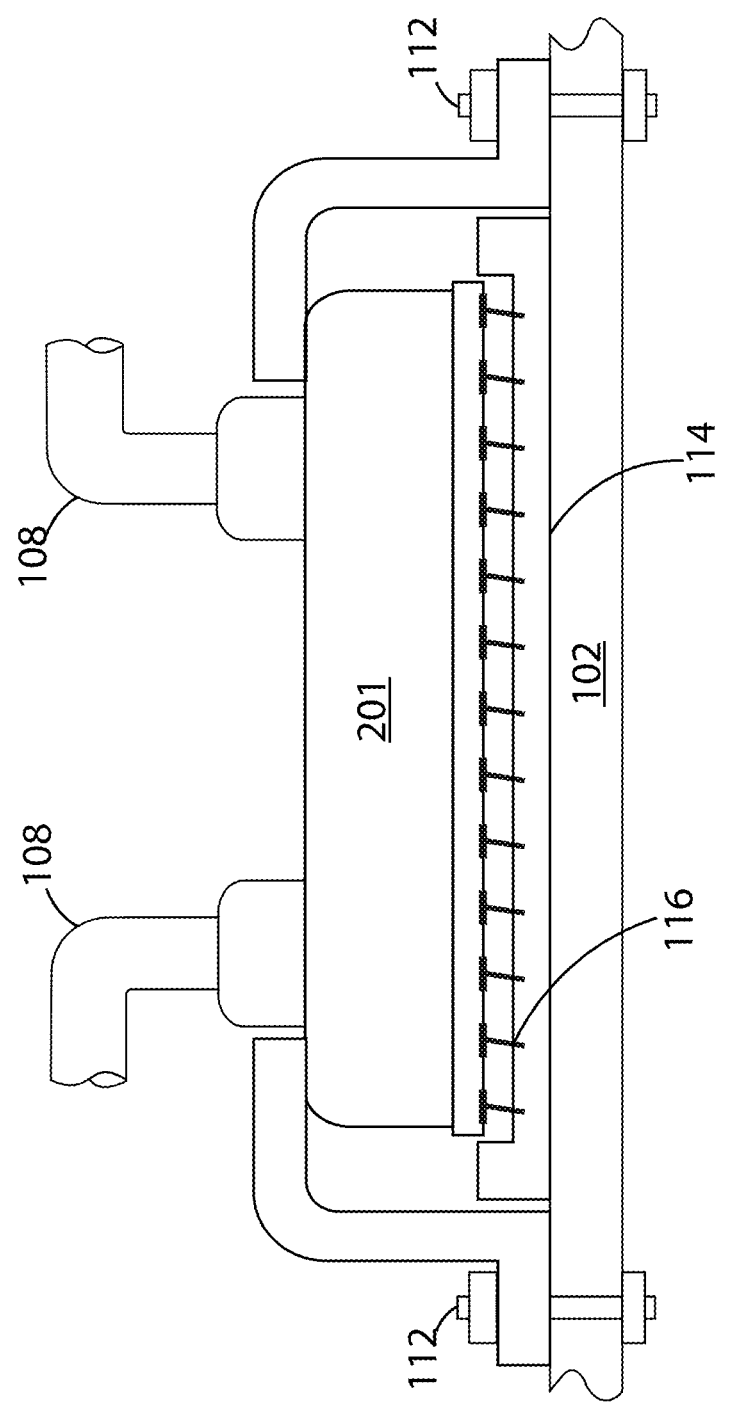
FIG. 2B is a schematic partial sectional side view of a device package mounted on a PCB, in accordance with embodiments of the present disclosure.

FIG. 2B is a schematic partial sectional side view of a portion of the system panel 100 of FIG. 2A. As shown, each device package 201 is fluidly coupled to the plurality of coolant lines 108 and is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112, e.g., compression screws, collectively configured to exert a relatively uniform downward force on the upward facing edges of the device package 201. The uniform downward force ensures proper pin contact between the device package 201 and the socket 114.

FIG. 2C is a schematic exploded isometric view of an example device package 201, in accordance with embodiments of the present disclosure. Generally, the device package 201 includes a package substrate 202, an integrated cooling assembly 203 disposed on the package substrate 202, and a package cover 208 disposed on a peripheral portion of the package substrate 202. Suitable materials that may be used in the package cover 208 include copper, aluminum, metal alloys, etc. The package cover 208 extends over the integrated cooling assembly 203 so that the integrated cooling assembly 203 is disposed between the package substrate 202 and the package cover 208. The integrated cooling assembly 203 typically includes a semiconductor device 204 and a cold plate 206 bonded to the semiconductor device 204. In some embodiments, the cold plate 206 may comprise substrate material like silicon, glass, ceramic, etc. Although the lateral dimensions (or footprint) of the cold plate 206 are shown to be the same or similar to the lateral dimensions (or footprint) of the semiconductor device 204, the footprint of the cold plate 206 may be smaller or larger in one or both directions when compared to the footprint of the semiconductor device 204.

As shown, the device package 201 further includes a sealing material layer 222 that forms a coolant fluid impermeable barrier between the package cover 208 and the integrated cooling assembly 203 that prevents leaking of the coolant fluid outside of the cooling assembly and prevents coolant fluid from reaching an active side 218 (discussed below in relation to FIG. 2D) of the semiconductor device 204 and causing damage thereto. In some embodiments, the sealing material layer 222 comprises an adhesive material that reliably attaches the package cover 208 to the integrated cooling assembly 203. In some embodiments, the sealing material layer 222 comprises a polymer or epoxy material that extends upwardly from the package substrate 202 to encapsulate and/or surround at least a portion of the semiconductor device 204. In some embodiments, the sealing material layer 222 may also comprise conductive material, e.g., solder. In other embodiments, the sealing material layer 222 is formed from a molding compound, e.g., a thermoset resin, that when polymerized, forms a hermetic seal between the package cover 208 and the cold plate 206. Here, the coolant fluid is delivered to the cold plate 206 through openings 222A disposed through the sealing material layer 222. As shown, the openings 222A are respectively in registration and fluid communication with inlet and outlet openings 212 of the package cover 208 thereabove and inlet and outlet openings 206A in the cold plate 206 therebelow.

It will be understood that the openings are shown in a section view. The openings may have any cross-sectional shape that allows fluid to flow therethrough (e.g., rectangular, square, hexagonal or circular cross-sections). For example, the inlet and outlet openings 206A of the cold plate 206 may form an elongated shape extending from one side of the cold plate 206 to another side of the cold plate 206. For example, the inlet and outlet openings 206A may form any shape having a length greater than a width in the X-Y plane (e.g., a rectangular or a trapezoidal shape). A shape in the X-Y plane of the openings 222A disposed through the sealing material layer 222 may be substantially the same as the shape of the inlet and outlet openings 206A of the cold plate 206 in the same place. Furthermore, it will be understood that all references to an opening throughout the present disclosure refer to an opening defined by a sidewall (e.g., opening sidewall).

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couples the integrated cooling assembly 203 to a system panel, such as the PCB 102.

Figure 2D:
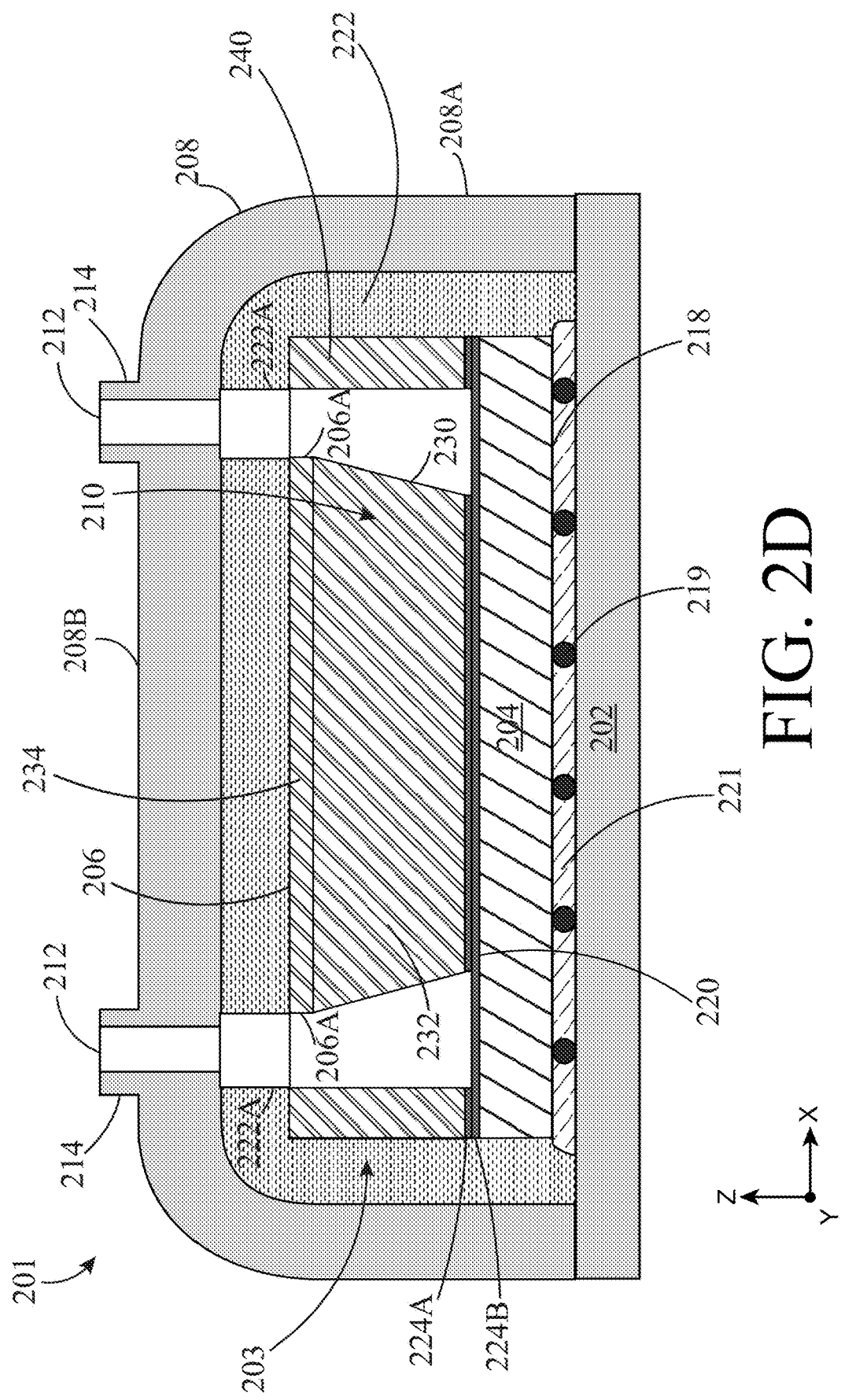
FIG. 2D is a schematic sectional view of an example device package, in accordance with embodiments of the present disclosure, that may be used with the system panel.

FIG. 2D is a schematic sectional view in the X-Z plane of the device package 201 taken along line A-A' of FIG. 2C. As illustrated in FIG. 2D, the semiconductor device 204 includes the active side 218 that includes device components, e.g., transistors, resistors, and capacitors, formed thereon or therein, and a non-active side, here the semiconductor device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the semiconductor device 204 and the package substrate 202. The first underfill layer 221 may comprise a cured polymer resin or epoxy, which provides mechanical support to the conductive bumps 219 and protects against thermal fatigue. In some embodiments, the active side 218 may be electrically connected to another package substrate, another active die, or another passive die (e.g., interposer) using hybrid bonding or conductive bumps 219. The cold plate 206 may be disposed above the package substrate 202 with the semiconductor device 204 disposed therebetween. For example, the semiconductor device 204 (and the first underfill layer 221) may be disposed between the cold plate 206 and the package substrate 202. In some embodiments, the cold plate 206 may be disposed directly on the package substrate 202.

Here, the cold plate 206 comprises a top portion 234 and a sidewall 240 (e.g., a perimeter sidewall defining a perimeter of the cold plate 206) extending downwardly from the top portion 234 to the backside 220 of the semiconductor device 204. The top portion 234, the perimeter sidewall 240, and the backside 220 of the semiconductor device 204 collectively define a coolant channel 210 therebetween. The cold plate 206 comprises cavity dividers 230 extending downwardly from the top portion 234 towards the backside 220 of the semiconductor device 204. The cavity dividers 230 may extends laterally and in parallel between an inlet opening 206A of the cold plate 206 and an outlet opening 206A of the cold plate 206 to define coolant channels 210 therebetween. It should be appreciated that, the cold plate 206 may comprise one cavity divider 230 which forms two coolant channels (e.g., one coolant channel on either side of the cavity divider 230) by means of the cavity divider 230 and portions of the perimeter sidewall 240. More specifically, coolant channels 210 may be formed between the cavity divider 230 and a portion of the perimeter sidewall 240 extending parallel to the cavity divider 230.

Figure 4:
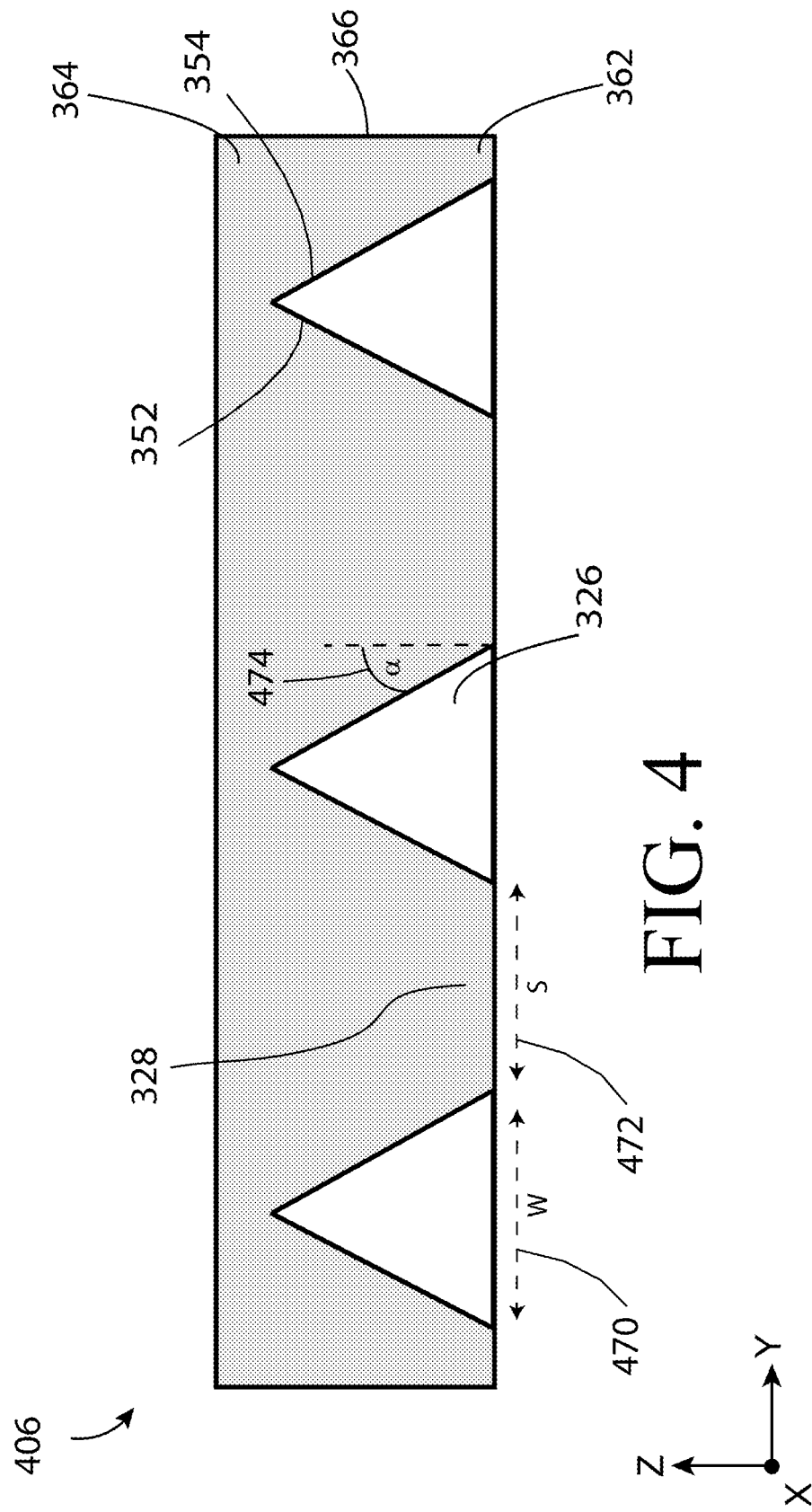
FIG. 4 is a partial schematic view of a cold plate in accordance with one or more embodiments.

Alternatively, in other embodiments, the cold plate 206 may comprise plural cavity dividers 230, for example two cavity dividers, five cavity dividers, or six cavity dividers (as illustrated in FIG. 4). In such examples, the cold plate 206 comprises more than two coolant channels 210, for example three coolant channels, four coolant channels, seven coolant channels, or more, defined between the cavity dividers 230 and/or the cavity divider(s) 230 and the perimeter sidewall 240.

The cavity dividers 230 comprise cavity sidewalls 232 which form surfaces of corresponding coolant channels 210. In some embodiments, the cavity sidewalls 232 comprise more than one sidewall (e.g., first cavity sidewalls 352 and second cavity sidewalls 354). In embodiments where plural cavity dividers 230 extend in parallel to each other, cavity sidewalls 232 of adjacent cavity dividers 230 are opposite (e.g., facing) each other. In embodiments comprising a single cavity divider 230, a first cavity sidewall may be opposite (e.g., face) a first portion of the perimeter sidewall 240 extending parallel to and facing the first cavity sidewall. A second cavity sidewall may be opposite (e.g., face) a second portion of the perimeter sidewall 240 extending parallel to and facing the second cavity sidewall. The first portion of the perimeter sidewall 240 may be an opposite side of the cold plate 206 to the second portion of the perimeter sidewall 240. For example, in embodiments where the cold plate 206 is rectangular, first and second opposing sides of the rectangular cold plate 206 form the first and second portions of the perimeter sidewall 240.

The cavity dividers 230 may be continuous cavity dividers which extend continuously (e.g., in the Y-axis direction) between the inlet opening 206A and the outlet opening 206A of the cold plate 206.

With reference to FIG. 2D, coolant channels 210 may be defined by:
the backside 220 of the semiconductor device 204, which forms lower coolant channel surfaces;
portions of the perimeter sidewall 240 extending in the Y-axis direction, which form end surfaces of the coolant channels 210;
the cavity sidewalls 232, which form inner surfaces of the coolant channels 210 in the X-axis direction; and
portions of the perimeter sidewall 240 extending in the X-axis direction, which form outer surfaces of the coolant channels 210 in the X-axis direction.

Here, the cavity sidewalls 232 are formed at an acute angle with respect to the backside 220 of the semiconductor device 204 such that upper portions of opposing (e.g., facing) cavity sidewalls 232 meet. Therefore, the cavity sidewalls 232 and the backside 220 of the semiconductor device 204 collectively define a triangular cross-section of the coolant channel 210.

In some embodiments, the backside 220 of the semiconductor device 204 comprises a corrosion protective layer (not shown). The corrosion protective layer may be a continuous layer disposed across the entire backside 220 of the semiconductor device 204, such that the cold plate 206 is attached thereto. Beneficially, the corrosion protective layer provides a corrosion-resistant barrier layer, thus preventing undesired corrosion of the semiconductor device 204 (e.g., the semiconductor substrate material which might otherwise be in direct contact with coolant fluid flowing through a coolant chamber volume 210).

One or more coolant chamber volumes may include one or more coolant channels. The coolant channels may extend between a single inlet opening and a single outlet opening of the cold plate 206, such that the coolant chamber volume(s) and/or coolant channel(s) share the same inlet and outlet openings. In some embodiments, multiple inlet and/or outlet openings may be coupled to the coolant chamber volume(s).

In embodiments having plural coolant chamber volumes and/or plural coolant channels, each coolant chamber volume and/or coolant channel may be connected between a separate inlet opening and a separate outlet opening. In such embodiments, the coolant fluid may be directed to the separate inlet openings and from the separate outlet openings using a manifold disposed above the openings in the Z-axis direction.

In some embodiments, the one or more coolant channels 210 have a triangular cross-section, shown in more detail in FIG. 3A, 3B, and 4 below. In some embodiments, the width (in the Y-axis) of the one or more coolant chamber channels 210 is approximately equal to the width of the spacing (in the Y-axis direction) between the one or more coolant chamber volumes 210. In some embodiments there are an odd number of coolant channels 210 formed in the cold plate 206. In some embodiments there are an even number of coolant channels 210 formed in the cold plate 206.

In some embodiments, a height in the Z-axis direction of the coolant chamber volume(s) and or coolant channel(s) may be greater than 100 µm, 100 µm-1000 µm, or 100 µm-700 µm. A width in the Y-axis direction of the coolant chamber volume(s) and/or coolant channel(s) may be greater than 100 µm, 100 µm-1000 µm, or 100 µm-700 µm. For example, the width of the coolant chamber volume(s) and/or coolant channel(s) may be greater than the height. A cross-section of the coolant chamber volume(s) and/or coolant channel(s) in the Y-Z plane is wide enough to allow for a pressure drop of 0-20 psi, 3-15 psi, or 4-10 psi.

In some embodiments, preparing a desired surface roughness of the sidewalls of the coolant chamber volume(s) and/or coolant channels may include depositing an organic layer on a photoresist layer after cold plate features have been etched to form a micro-masking layer, such as between 1 to 30 nm. The micro-masking layer may be dry etched to form the desired surface roughness, such as between 0.1 to 3.0 nm.

With reference to FIG. 2D, the cold plate 206 is attached to the backside 220 of the device 204 without the use of an intervening adhesive. For example, the cold plate 206 may be directly bonded to the backside 220 of the device 204, such that the cold plate 206 and the backside 220 of the device 204 are in direct contact. For example, in some embodiments, one or both of the cold plate 206 and the backside 220 of the semiconductor device 204 may comprise a dielectric material layer, e.g., a first dielectric material layer 224A and a second dielectric material layer 224B respectively, and the cold plate 206 is directly bonded to the backside 220 of the semiconductor device 204 through bonds formed between the dielectric material layers 224A, 224B. In some embodiments, one of the cold plate 206 or the backside 220 of the semiconductor device 204 may comprise a thin bonding dielectric layer (e.g., silicon nitride, etc.) and other element(s) may not include any such explicit bonding dielectric layer (or can have only a native oxide layer). The first and second dielectric material layers 224A, 224B may be continuous or non-continuous. For example, the first dielectric material layer 224A may be disposed only on lower surfaces of the cold plate 206 facing the backside 220 of the semiconductor device 204. With reference to FIG. 4, described below, portions of the first dielectric material layer 224A may be disposed only on lower surfaces of support features 230 and the perimeter sidewall 240. Beneficially, directly bonding the cold plate 206 to the semiconductor device 204, as described above, reduces the thermal resistance therebetween and increases the efficiency of heat transfer from the semiconductor device 204 to the cold plate 206. In particular, thermal resistance is reduced by directly bonding lower surfaces of the cavity dividers 230 facing the semiconductor device 204 to the backside 220 of the semiconductor device 204.

Figure 2E:
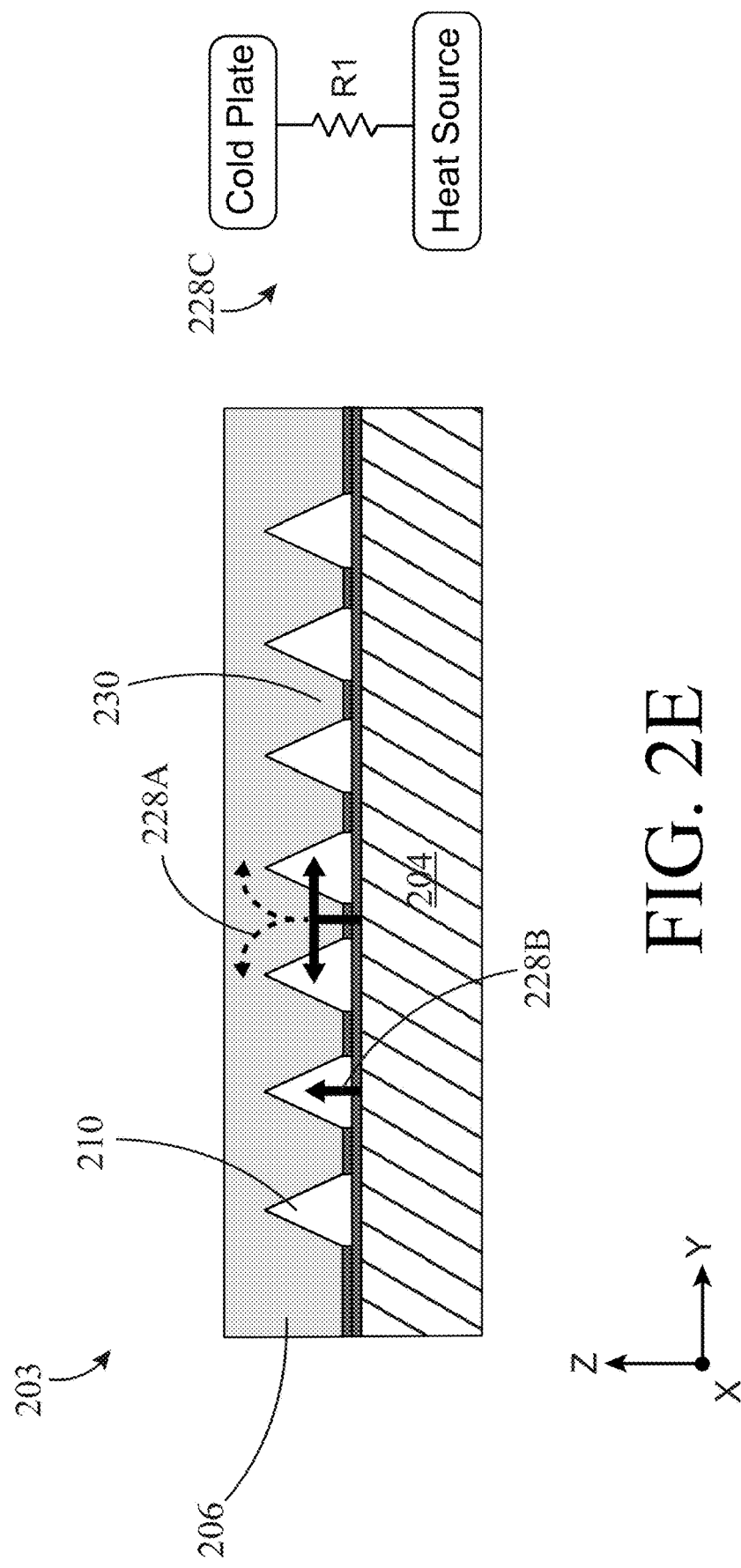
FIG. 2E is a schematic sectional view of an integrated cooling assembly of the device package, in accordance with embodiments of the present disclosure.

FIG. 2E is a schematic sectional view in the Y-Z plane of the integrated cooling assembly 203. In FIG. 2E, the cold plate 206 comprises a patterned side that faces towards the semiconductor device 204 and an opposite side that faces towards the package cover 208 (not shown). The patterned side comprises a coolant chamber volume having plural coolant channels 210, which extend laterally between the inlet and outlet openings of the cold plate 206. Each coolant channel 210 comprises cavity sidewalls that define a corresponding coolant channel 210. Portions of the cold plate 206 between the cavity sidewalls form support features 230. The support features 230 provide structural support to the integrated cooling assembly 203 and disrupt laminar fluid flow at the interface of the coolant and the device backside 220, resulting in increased heat transfer therebetween. Furthermore, by introducing plural coolant channels 210 to define separate coolant flow paths, an internal surface area of the cold plate 206 is increased, which further increases the efficiency of heat transfer.

In FIG. 2E, arrows 228A and 228B illustrate two different heat transfer paths in the integrated cooling assembly 203. A first heat transfer path illustrated by arrow 228B shows heat generated by the semiconductor device 204 transferring directly from the semiconductor material of the semiconductor device 204 to coolant fluid flowing through the cold plate 206. A second heat transfer path illustrated by arrows 228A shows heat generated by the semiconductor device 204 being transferred from semiconductor material (e.g., silicon material) of the semiconductor device 204 to semiconductor material (e.g., silicon material) of the cold plate 206 structure, propagated throughout the semiconductor material of the cold plate 206 structure (shown as dashed lines), and being transferring into coolant fluid flowing through the cold plate 206. A thermal resistance of the first and second heat transfer paths 228A, 228B is illustrated by heat transfer path 228C, which is shown as thermal resistance R1 between a heat source and a cold plate. Here, R1 is the thermal resistance of the bulk semiconductor material of the semiconductor device 204. It can be seen that the heat transfer path 228C of the integrated cooling assembly 203 is reduced compared to the heat transfer path 26 of the device package 10 of FIG. 1, due to the direct bonding discussed above.

In some embodiments, the cold plate 206 may be attached to the semiconductor device 204 using a hybrid bonding technique, where bonds are formed between the dielectric material layers 224A, 224B (see FIG. 2D) and between metal features, such as between first metal pads and second metal pads, disposed in the dielectric material layers 224A, 224B.

Suitable dielectrics that may be used as the dielectric material layers 224A, 224B include silicon oxides, silicon nitrides, silicon oxynitrides, silicon carbon nitrides, metal-oxides, metal-nitrides, silicon carbide, silicon oxycarbides, silicon oxycarbonitride, diamond-like carbon (DLC), or combinations thereof. In some embodiments, one or both of the dielectric material layers 224A, 224B are formed of an inorganic dielectric material, e.g., a dielectric material substantially free of organic polymers. Typically, one or both of the dielectric layers are deposited to a thickness greater than the thickness of a native oxide, such as about 1 nanometer (nm) or more, 5 nm or more, 10 nm or more, 50 nm or more, or 100 nm or more. In some embodiments, one or both of the layers are deposited to a thickness of 3 micrometers or less, 1 micrometer or less, 500 nm or less, such as 100 nm or less, or 50 nm or less. The dielectric layer material and thickness may be optimized for lower thermal resistance between the die and the cold plate.

The cold plate 206 may be formed of any suitable material that has sufficient structural strength to withstand the desired pressures of coolant flowing into the coolant chamber volume 210. For example, the cold plate 206 may be formed of semiconductor material like silicon or other engineered materials like glass. In other examples, the cold plate 206 may be formed of a material selected from a group comprising polymers, metals, ceramics, or composites thereof. In some embodiments, the cold plate 206 may be formed of stainless steel (e.g., from a stainless steel metal sheet) or a sapphire plate.

In some embodiments, the cold plate 206 may be formed of a bulk material having a substantially similar coefficient of linear thermal expansion (CTE) to the bulk material of the substrate 202 and/or the semiconductor device 204, where the CTE is a fractional change in length of the material (in the X-Y plane) per degree of temperature change. In some embodiments, the CTEs of the cold plate 206, the substrate 202, and/or the semiconductor device 204 are matched so that the CTE of the substrate 204 and/or the semiconductor device 204 is within about +/−20% or less of the CTE of the cold plate 206, such as within +/−15% or less, within +/−10% or less, or within about +/−5% or less when measured across a desired temperature range. In some embodiments, the CTEs are matched across a temperature range from about −60° C. to about 100° C. or from about −60° C. to about 175° C. In one example embodiment, the matched CTE materials each include silicon.

In some embodiments, the cold plate 206 may be formed of a material having a substantially different CTE from the semiconductor device 204, e.g., a CTE mismatched material. In such embodiments, the cold plate 206 may be attached to the semiconductor device 204 by a compliant adhesive layer (not shown) or a molding material that absorbs the difference in expansion between the cold plate 206 and the semiconductor device 204 across repeated thermal cycles.

The package cover 208 shown in FIGS. 2C and 2D generally comprises one or more vertical or sloped sidewall portions 208A and a lateral portion 208B that spans and connects the sidewall portions 208A. The sidewall portions 208A may extend upwardly from a peripheral surface of the package substrate 202 to surround the device 204 and the cold plate 206 disposed thereon. The lateral portion 208B may be disposed over the cold plate 206 and is typically spaced apart from the cold plate 206 by a gap corresponding to the thickness of the sealing material layer 222. Coolant is circulated through the coolant chamber volume 210 through the inlet and outlet openings 212 of the package cover 208 formed through the lateral portion 208B. The inlet and outlet openings 206A of the cold plate 206 may be in fluid communication with the inlet and outlet openings 212 of the package cover 208 through the inlet and outlet openings 222A formed in the sealing material layer 222 disposed therebetween. In certain embodiments, coolant lines 108 (FIGS. 2A-2B) may be attached to the device package 201 by use of connector features formed in the package cover 208, such as threads formed in the sidewalls of the inlet and outlet openings 212 of the package cover 208 and/or protruding features 214 that surround the inlet and outlet openings 212 and extend upwardly from a surface of the lateral portion 208B.

Typically, the package cover 208 is formed of semi-rigid or rigid material so that at least a portion of the downward force exerted on the package cover 208 by the mounting frame is transferred to a supporting surface of the package substrate 202 and not transferred to the cold plate 206 and the semiconductor device 204 therebelow. In some embodiments, the package cover 208 is formed of a thermally conductive metal, such as aluminum or copper. In such embodiments, the package cover 208 functions as a heat spreader that redistributes heat from one or more electronic components of the semiconductor device 204.

It should be noted that the direction in which the coolant fluid flows through the cold plate 206 may be controlled depending on the relative locations of the inlet and outlet openings. For example, the coolant fluid may flow from left to right in the device package 201 of FIG. 2D when the inlet openings 212, 222A, 206A of the package cover 208, the sealing material layer 222, and the cold plate 206, respectively, are located on the left-hand side of the device package 201 and the outlet openings 212, 222A, 206A of the package cover 208, the sealing material layer 222, and the cold plate 206, respectively, are located on the right-hand side of the device package 201. Alternatively, the coolant fluid may flow from right to left in the device package 201 illustrated in FIG. 2D when the outlet openings 212, 222A, 206A of the package cover 208, the sealing material layer 222, and the cold plate 206 are located on the left-hand side of the device package 201 and the inlet openings 212, 222A, 206A of the package cover 208, the sealing material layer 222, and the cold plate 206 are located on the right-hand side of the device package 201. Although only one set of inlet and outlet openings is shown and described here, additional inlet and outlet openings may also be provided at various locations on the package cover 208, the sealing material layer 222, and the cold plate 206.

An example flow path of the coolant fluid through the coolant chamber volume 210 may be as follows:
1. Coolant fluid enters the coolant chamber volume 210 through the inlet openings.
2. Coolant fluid flows across the inside surfaces of the cold plate 206 and absorbs heat generated by the semiconductor device 204, which has dissipated into the cold plate 206 structure. The coolant fluid may also flow directly across the backside 220 of the semiconductor device 204 to absorb heat energy directly from the semiconductor device 204. The coolant chamber volume 210 may additionally have various channels formed to direct the coolant fluid flow from inlet opening(s) to outlet opening(s) and facilitate heat extraction from the semiconductor device 204 by the coolant fluid. In some embodiments, the coolant fluid may be in direct contact with the backside 220 of the semiconductor device 204 or via one or more substrate or layers between the coolant fluid or backside 220 of the semiconductor device 204.

3. Coolant fluid exits the coolant chamber volume 210 through outlet openings.

It will be understood from the above flow path that heat is extracted without introducing an unnecessary thermal resistance (e.g., a TIM disposed between the backside 220 of the semiconductor device 204 and the cold plate 206) between the backside 220 of the semiconductor device 204 and the cold plate 206.

Figure 2F:
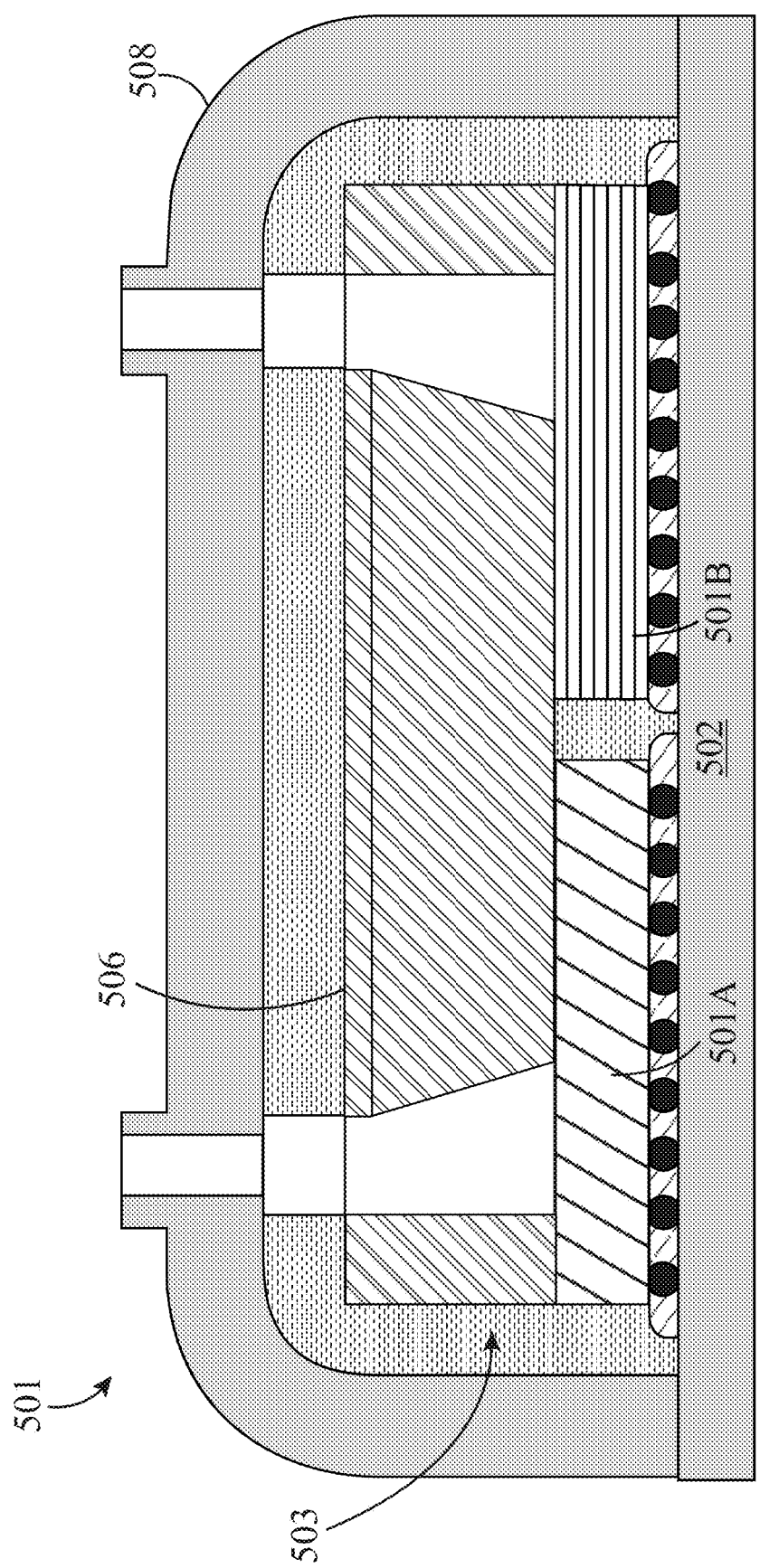
FIG. 2F is a schematic sectional view of another example device package, in accordance with embodiments of the present disclosure, that may be used with the system panel.

FIG. 2F is a schematic side sectional view in the X-Z plane of an example of a multi-component device package 501 that includes a cold plate 506 directly bonded to the backside surfaces of two or more devices 501A, 501B. The multi-component device package 501 may be similar to the device package 201 described above, and therefore the description of similar features is omitted for brevity. In some embodiments, the two or more devices 501A and 501B are reconstituted and then bonded to the cold plate 506. As shown, the device package 501 includes a package substrate 502, an integrated cooling assembly 503 and a package cover 508. The integrated cooling assembly 503 may include a plurality of devices 501A (one shown) that may be singulated and/or disposed in a vertical device stack 501B (one shown). The cold plate 506 may be attached to each of the devices 501A and device stack 501B, e.g., by the direct bonding methods described herein or other methods including flip chip bonding, etc. In some embodiments, the device 501A may comprise a processor, and the device stack 501B may comprise a plurality of memory devices. Here, the device 501A and the device stack 501B are disposed in a side-by-side arrangement on the package substrate 502 and are in electrical communication with one another through conductive elements formed in, on, or through the package substrate 502. Here, the cold plate 506 is sized to provide a bonding surface for attachment to both the device 501A and the device stack 501B but may otherwise be the same or substantially similar to other cold plates described herein. In some embodiments, the lateral dimensions (or footprint) of the cold plate 506 may be smaller or larger than the combined lateral dimensions (or footprint) of both the device 501A and the device stack 501B. In some embodiments, one or more sidewalls of the cold plate 506 may be aligned or offset to the vertical sidewalls of the device 501A and the device stack 501B (including inside or outside their footprint). In some embodiments, more than one cold plate 506 may be bonded. For example, separate cold plates may be bonded to the device 501A and the device stack 501B.

Figure 3A:
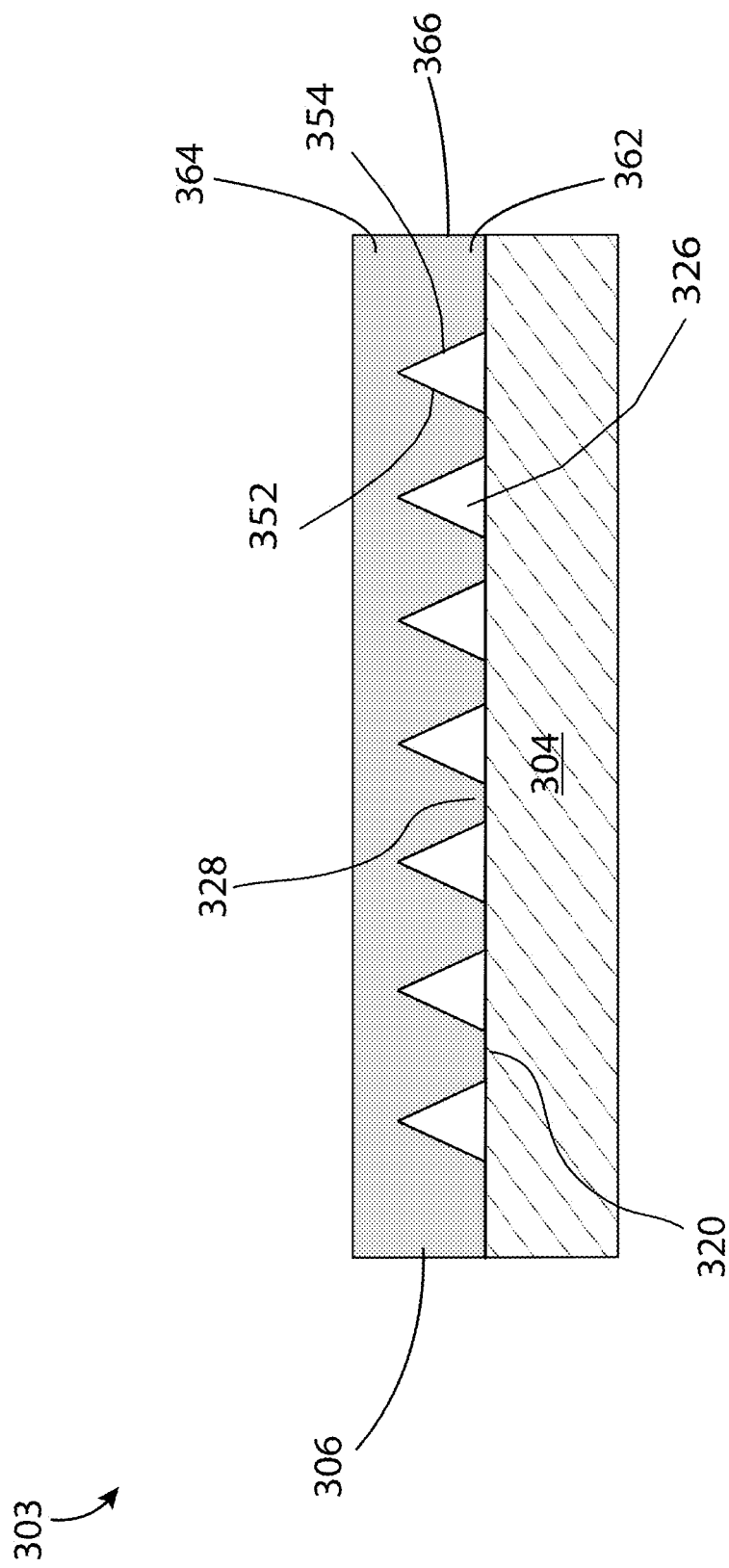
FIG. 3A is schematic of a cooling assembly having a cold plate and a semiconductor device, in accordance with one or more embodiments.

FIG. 3A is a schematic sectional view in the Y-Z plane of an example integrated cooling assembly 303, in accordance with embodiments of the disclosure, which may be used as part of the device package 201 of FIG. 2D, comprising a coolant chamber 326 design having triangular cross-sections. The integrated cooling assembly 303 comprises a cold plate 306 and a semiconductor device 304. Here, the semiconductor device 304 is bonded to the cold plate 306. As described above, the semiconductor device 304 may include an active side that includes device components (e.g., transistors, resistors, capacitors, etc.) formed thereon or therein, and a non-active side (e.g., the device backside) opposite the active side.

The cold plate 306 of the integrated cooling assembly 303 of FIG. 3A comprises a top portion 364 and a bottom portion 362 the top portion 364 being above the bottom portion 362 in the Z-axis, as shown in FIG. 3A. The bottom portion 362 of the cold plate 306 is the portion of the cold plate 306 which is bonded to the backside 320 of the semiconductor device 304. The cold plate 306 includes a sidewall 366 which defines the perimeter of the cold plate 306. The sidewall 366, in some embodiments, is the outer wall of the cold plate 306, and may be referred to as a perimeter sidewall 366.

In some embodiments, the top portion 364 of the cold plate 306 comprises first cavity sidewalls 352 and second cavity sidewalls 354 which extend toward the backside of the semiconductor device (and through the bottom portion 362 of the cold plate 306) at an angle with respect to the Z-axis direction to define a coolant chamber volume 326 therebetween. In some embodiments, the first cavity sidewalls 352 and second cavity sidewalls 354 form a pair of opposing cavity sidewalls. Such an arrangement is shown in FIG. 3A.

As can be seen in FIG. 3A, each coolant chamber volume 326 is defined by respective first cavity sidewalls 352 and second cavity sidewalls 354, which form pairs of opposing cavity sidewalls. The coolant chamber volumes 326 extend through the cold plate 306 in the X-axis direction and are spaced apart from each other along the cold plate 306 in the Y-axis. In the case of each coolant chamber volume 326, each first cavity sidewall 352 and second cavity sidewall 354 extends away from the top portion 364 of the cold plate 306 and through the bottom portion 362 of the cold plate 306 to the backside of the semiconductor device.

Between each of the coolant chamber volume 326 is a portion of the cold plate 306 which defines a divider 328 (e.g. a lower surface of the top portion 364). In some embodiments, the width of each divider 328 between adjacent cavity sidewalls 352, 354 and at the interface between the semiconductor device 304 and the cold plate 306 is approximately equal to the width of each coolant chamber volume 326. The cavity sidewalls 352, 354 slope such that they meet at a point as can be seen in FIG. 3A, and are spaced apart at the interface between the cold plate 306 and the semiconductor device 304 so as to form the triangular cross-section.

FIG. 3A shows a cold plate 306 attached to a semiconductor device 304. The cold plate 306 includes seven coolant chamber volumes 326 which extend laterally and in parallel between inlet/outlet openings 212 of the cold plate 306 (not shown). In some embodiments, this number of coolant chamber volumes 326 may be fewer or greater than seven. As discussed above, each of the coolant chamber volumes 326 may extend laterally between a single inlet opening 212 and a single outlet opening, such that the coolant chamber volumes 326 share the same openings. In other embodiments, each coolant chamber volume may comprise a separate inlet opening and a separate outlet opening.

Figure 3B:
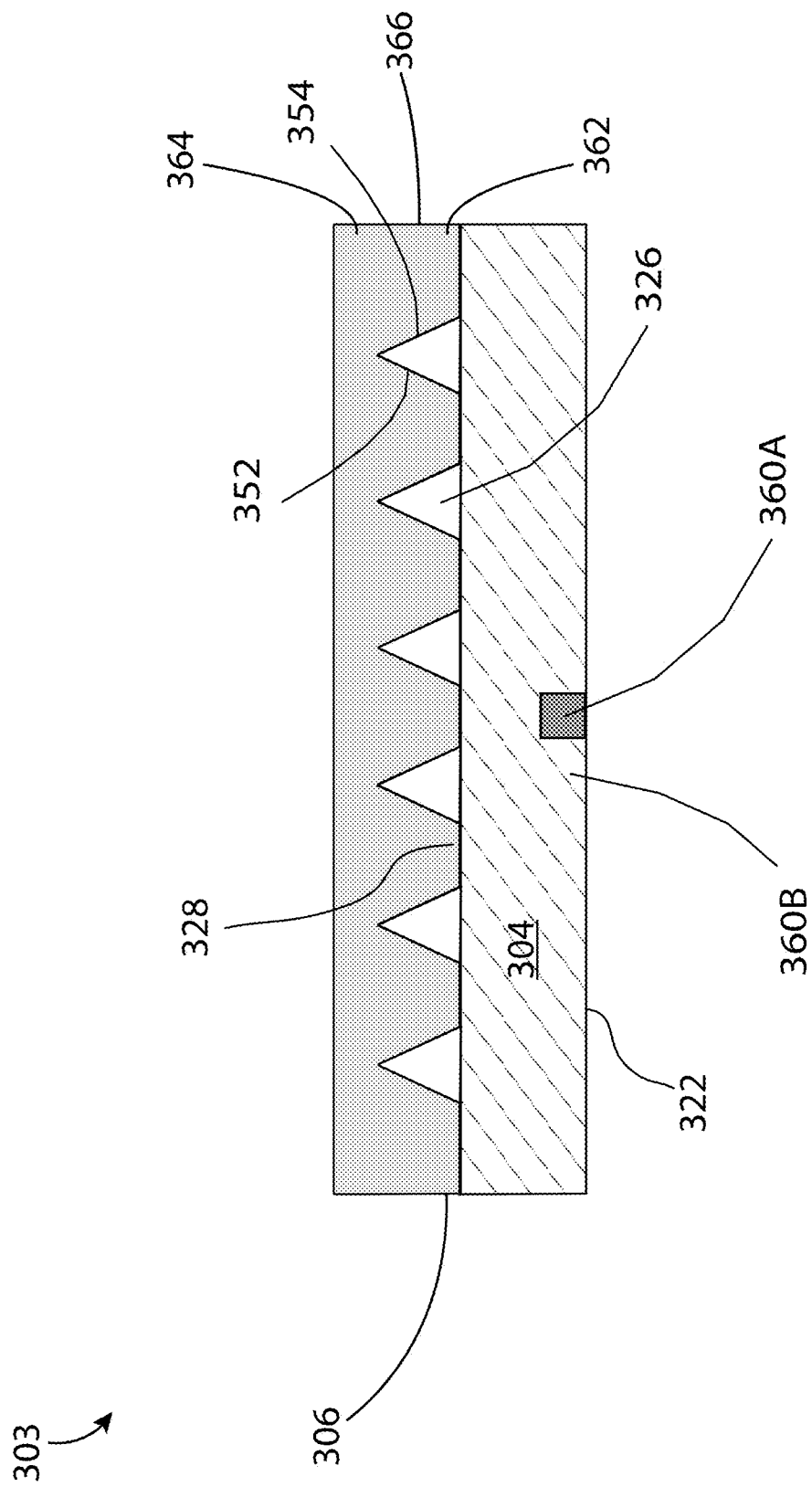
FIG. 3B is schematic of a cooling assembly having a cold plate and a semiconductor device, in accordance with one or more embodiments.

FIG. 3B is a schematic sectional view in the Y-Z plane of an example integrated cooling assembly 303, in accordance with embodiments of the disclosure. The integrated cooling assembly 303 of FIG. 3B includes a cold plate 306 having six coolant chamber volumes 326. FIG. 3B also shows a semiconductor device 304 having a hotspot region 360A on an active side 322 of the semiconductor device 304 and an adjacent region 360B. An adjacent region 360B may be any region of the active side 322 of the semiconductor device 304 which is not determined to be a hotspot region 360A.

A hotspot may be taken to mean an amount of heat energy passing through a certain surface which exceeds a threshold. Alternatively, a hotspot may be taken to mean a portion of a surface having a measurable temperature which exceeds a threshold. The heat energy may be measured as heat flux (or thermal flux) using thermal analysis methods such as microthermography. Here, a hotspot region 360A may be taken to mean a region of the backside 320 (i.e. surface) of the semiconductor device 304 at which an amount of heat energy is measured to exceed a threshold. The threshold may be relative to an amount of heat energy passing through the adjacent region 360B. For example, a region of the backside 320 may be determined to be a hotspot region 360A if the amount of thermal flux measured at that region exceeds the amount of thermal flux measured at an adjacent region 360B. Alternatively, a hotspot region 360A may be determined as any region of the backside 320 which exceeds a threshold temperature (e.g., 60 degrees Celsius, 75 degrees Celsius or 90 degrees Celsius).

It will be understood that a hotspot region may not be defined by a single uniform temperature measured within a predefined perimeter. A hotspot region may comprise a hottest portion (e.g., central portion) at which a measured temperature is highest and contours of temperatures surrounding the central portion. For example, a temperature gradient of the hotspot region may be highest in the central portion and gradually reduce towards edges of the hotspot region. Furthermore, a hotspot region may not have a fixed perimeter and edges of a hotspot region may not be defined by a regular shape. That is, as the thermal flux generated by a hotspot region fluctuates, the hotspot region may grow and reduce is size and shape. Therefore, a hotspot region may be any shape having a hottest portion (e.g., central portion) with a temperature that exceeds a threshold, as discussed above.

The hotspot region 360A may be a region exposed to higher thermal energy relative to at least one other region of the device 304, for example the adjacent region 360B. The hotspot region 360A may have an associated first temperature when the semiconductor device 304 is in use and the adjacent region 360B may have an associated second temperature when the semiconductor device 304 is in use. The first temperature may be higher than the second temperature. For example, the first temperature may be 70 degrees Celsius and the second temperature may be 45 degrees Celsius. It will be understood that the difference between the first and second temperatures may vary according to the operating conditions and the types of components operating in the different regions.

The heat energy passing through and/or measured at the backside 320 may be generated by components of the semiconductor device 304. That is, electronic components may be positioned adjacent to the backside 320 within the semiconductor device 304 such that heat energy generated by the electronic components dissipates into and/or through the structure of the backside 320 as the electronic components function. For example, the hotspot region 360A may comprise one or more electronic components with a relatively high power dissipation rate, such as a computational core, neural core or graphical processing unit. In such embodiments, the inlet opening of the cold plate may be disposed over (i.e. overlap) or slightly offset from the processing unit (e.g., processing core region, CPU, GPU, NPU, etc.) of a semiconductor device to which the cold plate is attached. Such core regions may generally have higher power and thermal density than the adjacent regions of a semiconductor device.

On the other hand, the adjacent region 360B may comprise one or more electronic components with a relatively low power dissipation rate, such as a memory unit, I/O unit, PHY unit or analog unit. In other examples, the adjacent region 360B may comprise no electronic component therein.

In FIG. 3B, the hotspot region 360A of the semiconductor device 304 is aligned with a divider 328 portion of the cold plate 306. The divider 328 is disposed between first and second adjacent coolant chamber volumes 326. The divider 328 extends away from the top portion 364 of the cold plate 306 and toward the backside 320 of the semiconductor device 304.

Beneficially, the heat dissipation from the hotspot region 360A is improved if the hotspot 360A is aligned with a divider 328 as compared to positioning a coolant chamber volume 326. The thermal performance of the cold plate 306 may be maximized when the hotspot region 360A is aligned with a divider 328 of the cold plate 306.

In some examples, the cold plate 306 may be configured such that the hotspot region 360A is exposed to a coolant chamber volume 326. In some examples, the cold plate 306 is configured such that an equal number of coolant chamber volumes 326 are positioned either side of the hotspot region 360A of the semiconductor device 304. The configuration of the coolant chamber volumes 326 and dividers 328 may be determined based on the positioning of one or more hotspots 360A of the semiconductor device 304.

In some cases, the semiconductor device 304 includes multiple hotspot regions 360A. In such cases, the coolant chamber volumes 326 and the dividers 328 of the cold plate 306 may be arranged such that each hotspot region 360A of the semiconductor device 306 is aligned with a coolant chamber volume 326. That is, dividers may be disposed either side of each hotspot region to expose each hotspot region to a different coolant chamber volume.

In both FIG. 3A and FIG. 3B, the coolant chamber volumes 326 are evenly spaced. In some cases, the coolant chamber volumes 326 may be spaced unevenly. In some cases, the coolant chamber volumes 326 may be arranged in dependence upon the location of a hotspot region 360A of a semiconductor device 304. In some cases, the coolant chamber volumes 326 may be arranged such that the coolant chamber volumes 326 are spaced further apart in one section of the cold plate 306 and closer together in another section of the cold plate 306.

FIG. 4 is a schematic sectional view in the Y-Z plane of an example cold plate 406, in accordance with embodiments of the disclosure. FIG. 4 shows, a section of a cold plate 406 which corresponds generally to the cold plate 306 shown in FIGS. 3A and 3B, and therefore description of like features will be omitted for brevity. In FIG. 4, the coolant chamber width 470 of the coolant chamber volume 326 is denoted as W and the coolant chamber spacing 472, the spacing between the coolant chamber volumes 326, is denoted as S. In general, the cooling performance of the cold plate 406 is optimal when the coolant chamber width 470 is approximately equal to the coolant chamber spacing 472, such that the ratio of W to S is about 1 to 1. Such a ratio of coolant chamber width 470 to coolant chamber spacing 472 gives rise to relatively low thermal resistance whilst providing optimal thermal performance, such that the efficiency of heat dissipation from the semiconductor device 304 into the cold plate 306 and the coolant flowing therethrough is maximized.

In some examples, the ratio of W to S differs from about 1 to 1. In some examples, the coolant chamber spacing 472, denoted as S may be larger than the coolant chamber width 470, denoted as W. In some examples, S may be around 5% larger than W. In some examples, S may be around 10% larger than W. In some examples, S may be around 20% larger than W. In some examples, S may be around 50% larger than W. In some examples, S may be more than 50% larger than W.

In some examples, the coolant chamber spacing 472, denoted as S may be smaller than the coolant chamber width 470, denoted as W, such that the coolant chamber width 470 is greater than the coolant chamber spacing 472. In some examples, W may be around 5% larger than W. In some examples, W may be around 10% larger than S. In some examples, W may be around 20% larger than S. In some examples, W may be around 50% larger than S. In some examples, W may be more than 50% larger than S.

In some examples, the coolant chamber spacing 472 may differ across the cold plate 406, with the coolant chamber spacing 472 being different between each coolant chamber volume 326. In some examples, the coolant chamber width 470 may differ across the cold plate 406, with the coolant chamber width 470 varying for some or all of the coolant chamber volumes 326.

FIGS. 3A, 3B, and 4 all show coolant chamber volumes 326 having a triangular cross-section. The triangular cross-section of the coolant chamber volumes 326, defined by the cavity sidewalls 352, 354, may be formed by etching the top surface 362 of the cold plate 306 to form the cavity sidewalls 352, 354 which form each coolant chamber volume 326. The coolant chamber volumes 326 may in some examples take a trapezoid shape, such that the cavity sidewalls 352, 354 are spaced apart from one another and the coolant chamber volume 326 having a base. Coolant chamber volumes 326 having a triangular cross-section may present an advantage over coolant chamber volumes having a trapezoidal cross-section because an increased number of coolant chamber volumes 326 having triangular cross-sections may be accommodated in a cold plate 306 as compared to coolant chamber volumes having a trapezoidal cross-section.

For a cold plate having coolant chamber volumes 326 therein having a length L, more coolant chamber volumes 326 having a triangular cross-section than coolant chamber volumes having a trapezoidal cross-section may be accommodated. In some cases, the increased number of coolant chamber volumes 326 having a triangular cross-section is twice as many as coolant chamber volumes having a trapezoidal cross-section. The perimeter of the respective coolant chamber volumes 326 may be defined as the length of the cavity sidewall 352, 354 of the coolant channel which is closest to the semiconductor device 304.

More coolant chamber volumes 326 having a triangular cross-section gives rise to more length of sidewall. In turn, this gives rise to a greater perimeter of coolant chamber volumes 326, and therefore a greater surface area available for a cooling interface between a semiconductor device 304 and a coolant in the coolant chamber volumes 326. For example, a cold plate 306 having twenty coolant chamber volumes 326 having a triangular cross-section provides 45% more cooling perimeter than the same cold plate 306 having ten coolant chamber volumes 326 having a trapezoid cross-section.

Returning to a discussion of FIG. 4, the sidewall angle 474, denoted as α, which is the angle of the cavity sidewalls 352, 354 with respect to the sidewall 366 of the cold plate, which is parallel with the Z-axis of the cold plate 306. The sidewall angle 474 may generally be less than 90 degrees. In some examples, the sidewall angle 474 may be around 55 degrees. In some examples, the sidewall angle 474 may be less than or greater than 55 degrees. In some examples, the sidewall angle 474 may be constrained by the process used to form the cavity sidewalls 352, 354, In some examples, the sidewall angle 474 is constrained by the etch process used to form the cavity sidewalls 352, 354.

Figure 5:
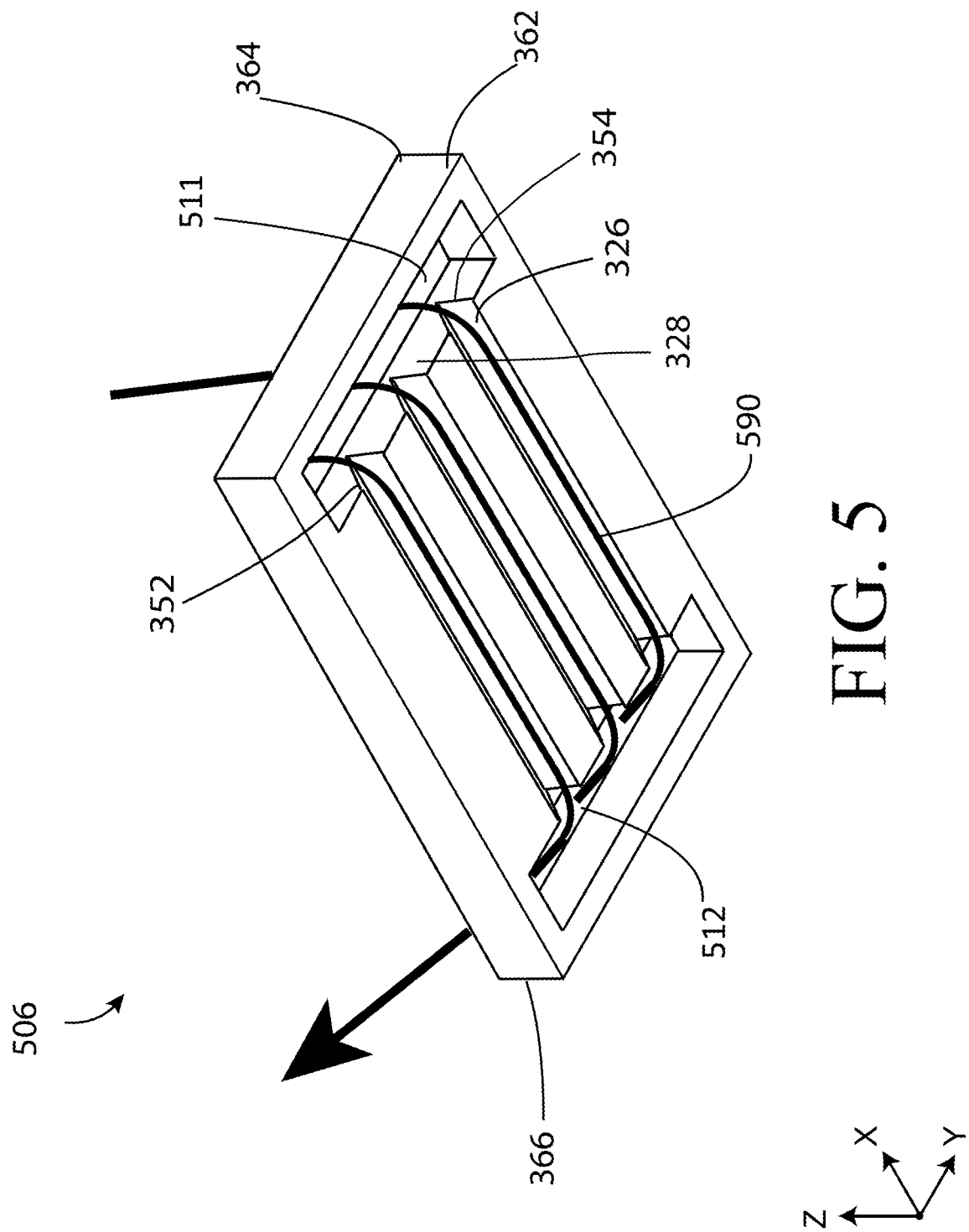
FIG. 5 is an isometric view of a cold plate in accordance with one or more embodiments.

FIG. 5 shows an isometric view of a cold plate 506 which generally corresponds to the configuration of the cold plate 406 shown in FIG. 4. The cold plate 506 shown in FIG. 5 generally corresponds to the cold plate 406 shown in FIG. 4, and therefore description of like features will be omitted for brevity. The cold plate 506 of FIG. 5 includes an inlet 511, an outlet 512, and three coolant chamber volumes 326 extending laterally between the openings 511, 512. As can be seen in FIG. 5, the coolant chamber volumes 326 take a generally triangular cross-section and extend along the cold plate 506 between the inlet 511 and the outlet 512. The cold plate 506 of FIG. 5 includes three coolant chamber volumes 326, but as described herein, the cold plate 506 may include more than three or less than three coolant chamber volumes 326.

A fluid flow path 590 is shown in FIG. 5. The fluid flow path 590 enters the cold plate 506 via the inlet 511, passes through the coolant chamber volumes 326, and out of the outlet 512. In some examples, an inlet manifold may be included to split the fluid flow 590 between the coolant chamber volumes 326 from the inlet 511. In some examples, an outlet manifold may be included to collect the fluid flow from the coolant chamber volumes 326 and pass the fluid flow 590 out of the outlet 512. In some examples, each coolant chamber volume 326 may have its own inlet and/or outlet.

The cavity sidewalls 352, 354 form the walls of the coolant chamber volumes 326. The perimeter sidewall 366 of the cold plate 306 forms the outer wall of the cold plate 306 and defines a perimeter thereof. The cavity sidewalls 352, 354 shown in FIG. 5 are opposing pairs of cavity sidewalls 352, 354.

Figure 6:
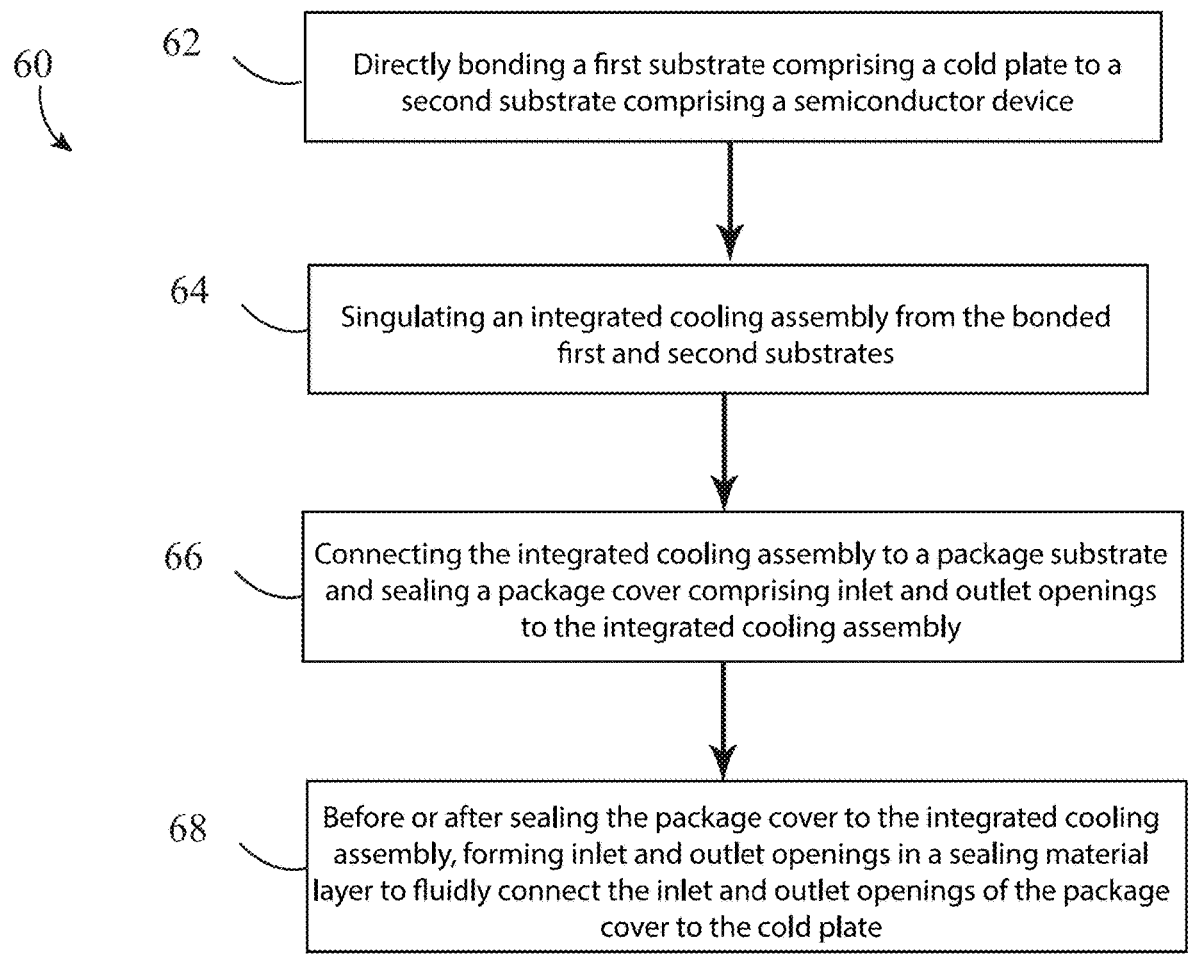
FIG. 6 shows a method that can be used to manufacture the device package described herein.

FIG. 6 is a flow diagram showing a method 60 of forming an integrated cooling assembly, according to embodiments of the present disclosure. Generally, the method 60 includes bonding a first substrate comprising one or more cold plates 206 to a second substrate comprising one or more semiconductor devices 204, and singulating one or more integrated cooling assemblies 203 from the bonded first and second substrates. For example, a wafer (bare or reconstituted wafer) comprising one or more cold plates 206 can be directly bonded to another wafer (bare or reconstituted wafer) comprising one or more semiconductor devices 204.

It will be understood that the first substrate may be a cold plate die or part of a wafer of cold plates. Further, the second substrate may be a semiconductor device die or part of a wafer of semiconductor devices 204. Therefore, the method 60 may include die-to-die direct bonding (e.g., cold plate die to semiconductor device die), wafer-to-die direct bonding (e.g., cold plate die to semiconductor device wafer, or cold plate wafer to semiconductor device die), and wafer-to-wafer direct bonding (e.g., cold plate wafer to semiconductor device wafer). It will be understood that the singulation step (discussed in relation to block 64, below) may not be required for a die-to-die direct bonding operation.

For simplicity, the following description is focused on forming one integrated cooling assembly 203 comprising one cold plate 206 and one semiconductor device 204. However, as mentioned above, in some embodiments, the first substrate may comprise plural cold plates 206 and the second substrate may comprise plural semiconductor devices 204, such that plural integrated cooling assemblies 203 may be formed from the first and second substrates.

At block 62, the method 60 includes directly bonding the first substrate (e.g., a monocrystalline silicon wafer) comprising a cold plate 206 to the second substrate (e.g., a monocrystalline silicon wafer) comprising a semiconductor device 204 without an intervening adhesive.

In some embodiments, the first substrate may be etched using a patterned mask layer formed on its surface to form features of the cold plate 206. An anisotropic etch process may be used, which uses inherently differing etch rates for the silicon material as between {100} plane surfaces and {111} plane surfaces when exposed to an anisotropic etchant.

In some embodiments, the etching process is controlled to where the etch rates of the substrate surfaces have a ratio between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide ($HN_4OH$), hydrazine ($N_2H_4$), or tetra methyl ammonium hydroxide (TMAH). The actual etch rates of the silicon substrate depend on the concentration of the etchant in the aqueous solution, the temperature of the aqueous solution, and a concentration of the dopant in the substrate (if any). Typically, the mask layer is formed of a material that is selective to anisotropic etch compared to the underlying monocrystalline silicon substrate. Examples of suitable mask materials include silicon oxide ($Si_xO_x$) or silicon nitride ($Si_xN_y$). In some embodiments, the mask layer has a thickness of about 100 nm or less, such as about 50 nm or less, or about 30 nm or less. The mask layer may be patterned using any suitable combination of lithography and material etching patterning methods.

In some embodiments, a duration of the etching process is controlled to achieve a coolant chamber volume having a triangular cross-section.

The second substrate may include a bulk material, and a plurality of material layers disposed on the bulk material. The bulk material may include any semiconductor material suitable for manufacturing semiconductor devices, such as silicon, silicon carbide, silicon germanium, germanium, group III-V semiconductor materials, group II-VI semiconductor materials, or combinations thereof. While some high-performance processors like CPUs, GPUs, neural processing units (NPUs), and tensor processing units (TPUs) are typically made out of silicon, some other high power density (hence substantial heat-generating) devices may comprise silicon carbide or gallium nitride, for example. In some embodiments, the second substrate may include a monocrystalline wafer, such as a silicon wafer, a plurality of device components formed in or on the silicon wafer, and a plurality of interconnect layers formed over the plurality of device components. In other embodiments, the second substrate may comprise a reconstituted substrate, e.g., a substrate formed from a plurality of singulated devices embedded in a support material. In some embodiments, each semiconductor device may have its own individual cold plate fabricated through a reconstitution process.

The bulk material of the second substrate may be thinned after the semiconductor device 204 is formed using one or more backgrinding, etching, and polishing operations that remove material from the backside. Thinning the second substrate may include using a combination of grinding and etching processes to reduce the thickness (in the Z-direction) to about 450 µm or less, such as about 200 µm or less, or about 150 µm or less or about 50 µm or less. After thinning, the backside 220 may be polished to a desired smoothness using a chemical mechanical polishing (CMP) process, and the dielectric material layer may be deposited thereon. In some embodiments, the dielectric material layer may be polished to a desired smoothness to prepare the second substrate for the bonding process. In some embodiments, the method 60 includes forming a plurality of metal features in the dielectric material layer in preparation for a hybrid bonding process, such as by use of a damascene process.

In some embodiments, the active side of the second substrate is temporarily bonded to a carrier substrate (not shown) before or after the thinning process. When used, the carrier substrate provides support for the thinning operation and/or for the thinned material to facilitate substrate handling during one or more of the subsequent manufacturing operations described herein.

Here, the method 60 may include forming dielectric layers on one or both the first and second substrates, and directly bonding includes forming dielectric bonds between a first dielectric material layer of the first substrate and a second dielectric material layer of the second substrate (or forming dielectric bonds between one substrate and a dielectric material layer of the other substrate). Direct bonding processes join dielectric layers by forming strong chemical bonds (e.g., covalent bonds) between the dielectric layers.

Generally, directly bonding the surfaces (of the dielectric material layers formed on the first and second substrates) includes preparing, aligning, and contacting the surfaces. Examples of dielectric material layers include silicon oxide, silicon nitride, silicon oxynitride, and silicon carbonitride. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the first and second substrates using a CMP process. Activating and terminating the surfaces with a desired species may include exposing the surfaces to radical species formed in a plasma. The bond interface between the bonded dielectric layers can include a higher concentration of materials from the activation and/or last chemical treatment processes compared to the bulk of the bonding layers. For example, in some embodiments that utilize a nitrogen plasma for activation, a nitrogen concentration peak can be formed at the bond interface. In some embodiments, the nitrogen concentration peak may be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen concentration peak can be formed at the bond interface between non-conductive bonding surfaces.

In some embodiments, the plasma is formed using a nitrogen-containing gas, e.g., $N_2$, and the terminating species includes nitrogen, or nitrogen and hydrogen. In some embodiments, fluorine may also be present within the plasma. In some embodiments, the surfaces may be activated using a wet cleaning process, e.g., by exposing the surfaces to an aqueous ammonia solution. In some embodiments, the dielectric bonds may be formed using a dielectric material layer deposited on only one of the first and second substrates, but not on both. In those embodiments, the direct dielectric bonds may be formed by contacting the deposited dielectric material layer of one of the first and second substrates directly with a bulk material surface (or such a surface with a native oxide) of the other substrate.

Directly forming direct dielectric bonds between the first and second substrates at block 62 may include bringing the prepared and aligned surfaces into direct contact at a temperature less than 150° C., such as less than 100° C., for example, less than 30° C., or about room temperature, e.g., between 20° C. and 30° C. Without intending to be bound by theory, in the case of directly bonding surfaces terminated with nitrogen and hydrogen (e.g., $NH_2$ groups), it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C., for a duration of about 5 minutes or more, such as about 15 minutes. Typically, the bonds will strengthen over time even without the application of heat. Thus, in some embodiments, the method does not include heating the substrates.

In embodiments where the first and second substrates are bonded using hybrid dielectric and metal bonds, the method 60 may further include planarizing or recessing the metal features below the dielectric field surface before contacting and bonding the dielectric material layers. After the dielectric bonds are formed, the first and second substrates may be heated to a temperature of 150° C. or more and maintained at the elevated temperature for a duration of about 1 hour or more, such as between 8 and 24 hours, to form direct metallurgical bonds between the metal features.

Suitable direct dielectric and hybrid bonding technologies that may be used to perform aspects of the methods described herein include ZiBond® and DBI®, each of which are commercially available from Adeia Holding Corp., San Jose, CA, USA.

At block 64, the method 60 includes singulating at least one integrated cooling assembly 203 from the bonded first and second substrates. Singulation after bonding may impart distinctive structural characteristics on the integrated cooling assembly 203 as the bonding surface of the cold plate 206 has the same perimeter as the backside of the semiconductor device 204 bonded thereto. Thus, the sidewalls (e.g., side surfaces) of the cold plate 206 are typically flush with the edges (e.g., side surfaces) of the semiconductor device 204 about their common perimeters. In some embodiments, the cold plate 206 is singulated from the first substrate using a process that cuts or divides the first substrate in a vertical plane, i.e., in the Z-direction. In those embodiments, the side surfaces of the cold plate 206 are substantially perpendicular to the backside 220 of the semiconductor device 204, i.e., a horizontal (X-Y) plane of an attachment interface between the semiconductor device 204 and the cold plate 206. In some embodiments, the cold plate 206 is singulated using a saw or laser dicing process.

At block 66, the method 60 may include connecting the integrated cooling assembly 203 to the package substrate 202 and sealing a package cover 208 comprising inlet and outlet openings 212 to the integrated cooling assembly 203 by use of a molding compound that, when cured, forms a sealing material layer 222.

At block 68, the method 60 may include, before or after sealing the package cover 208 to the integrated cooling assembly 203, forming inlet and outlet openings 222A in the sealing material layer 222 to fluidly connect the inlet and outlet openings 212 of the package cover 208 to the cold plate 206.

Figure 7:
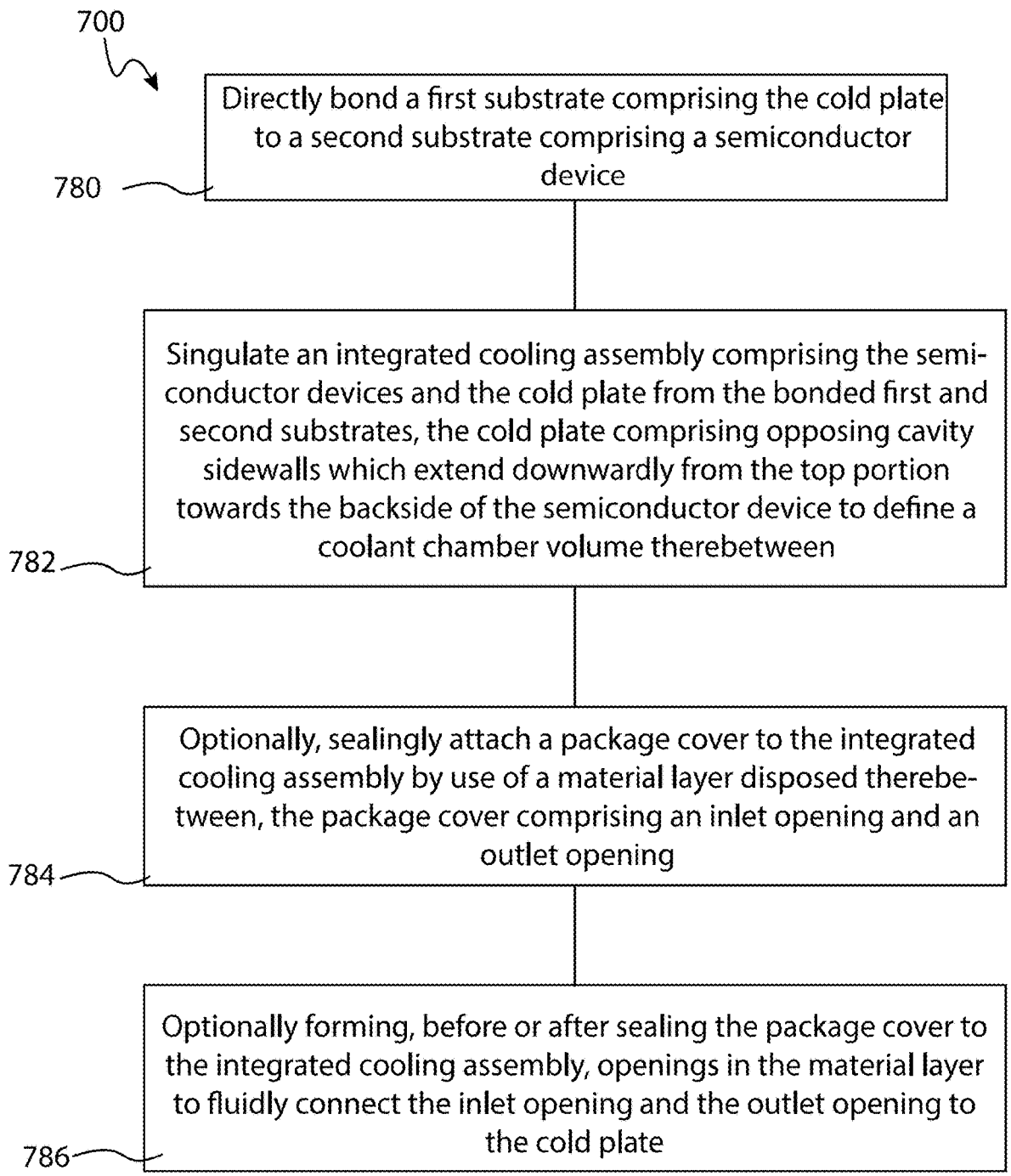
FIG. 7 shows a method that can be used to manufacture the integrated cooling assemblies described herein.

FIG. 7 is a flow diagram setting forth a method 700 of forming an integrated cooling assembly, according to embodiments of the disclosure.

The method 700 may include forming dielectric layers on the cold plate and the second substrate (i.e., on upper exposed surfaces of the semiconductor device), and directly bonding includes forming dielectric bonds between a first dielectric material layer of the cold plate and a second dielectric material layer of the semiconductor device.

At block 780, the method 700 includes directly bonding a first substrate (e.g., a monocrystalline silicon wafer) comprising the cold plate 206, 306 to a second substrate (e.g., a monocrystalline silicon wafer) comprising a semiconductor device (e.g., semiconductor device 204, 304). For example, the first substrate may be etched using a patterned mask layer formed on surfaces of the respective substrates. The anisotropic etch process uses inherently differing etch rates for the silicon material which is exposed to an anisotropic etchant when the patterned mask layer is formed. It will be understood that, in some embodiments, the first substrate and/or the second substrate may be a semiconductor device (e.g., a die), such that block 780 may include direct die-to-die bonding and direct wafer-to-die bonding, in addition to wafer-to-wafer bonding.

It will be understood that first substrate may be a semiconductor device die or part of a wafer of semiconductor devices. Further, the second substrate may be a cold plate die or part of a wafer of cold plates. Therefore, block 780 may include direct die-to-die bonding (e.g., cold plate die to semiconductor device die), direct wafer-to-die bonding (e.g., cold plate die to semiconductor device wafer, or cold plate wafer to semiconductor device die), and wafer-to-wafer bonding (e.g., cold plate wafer to semiconductor device wafer).

At block 782, the method 700 includes singulating an integrated cooling assembly 203, 303, comprising the semiconductor device 204, 304 and the cold plate 206, 306 from the bonded first and second substrates.

At block 784, the method 700 comprises sealingly attaching a package cover to the integrated cooling assembly by use of a material layer disposed therebetween, where the package cover comprising an inlet opening and an outlet opening.

At block 786, the method 700 comprises before or after sealing the package cover 208 to the integrated cooling assembly 203, forming openings in the material layer to fluidly connect the inlet opening and the outlet opening to the cold plate.

The method described above advantageously provides for integrated cooling assemblies that include cooling channel arrangements which increase cooling to semiconductor devices within a device package.

Figure 8:
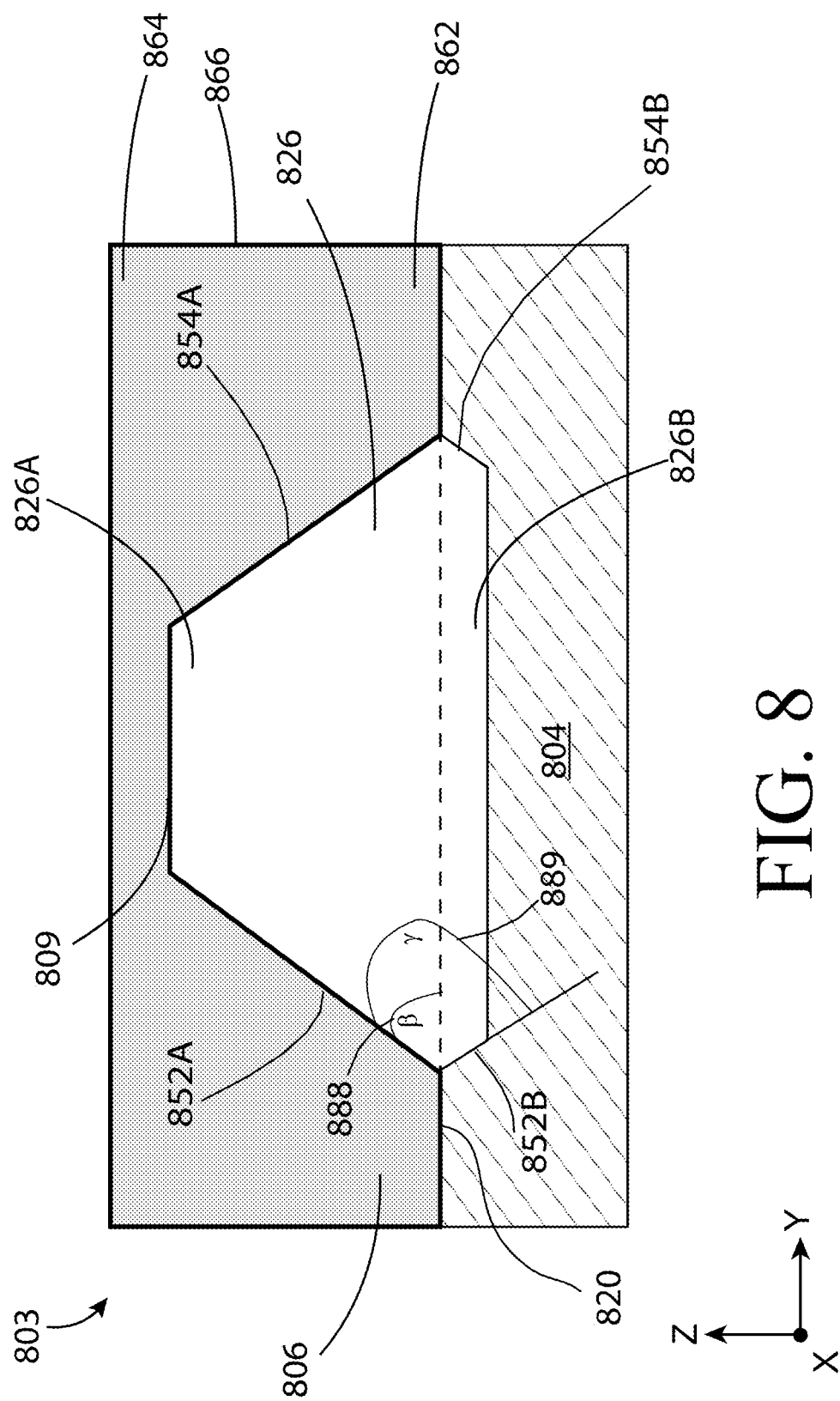
FIG. 8 is a partial schematic view of a cooling assembly having a cold plate and a semiconductor device, in accordance with one or more embodiments.

FIG. 8 is a schematic sectional view in the Y-Z plane of an example integrated cooling assembly 803, in accordance with embodiments of the disclosure. FIG. 8 shows a portion of a cooling assembly 803 which includes a cold plate 806 and a semiconductor device 804. Similar to that described above in connection with cooling assembly 303 and cold plate 406, a coolant chamber volume 826 is provided. The cold plate 806 includes a top portion 864 and a bottom portion 862. The cold plate 806 includes a sidewall 866 which defines the perimeter of the cold plate 806. The sidewall 866, in some embodiments, is the outer wall of the cold plate 806, and may be referred to as a perimeter sidewall 866. As can be seen from FIG. 8, the coolant chamber volume 826 is formed of a first coolant chamber portion 826A and a second coolant chamber portion 826B which combine to form the coolant chamber volume 826. The first coolant chamber portion 826A is formed in the cold plate 806 in a similar manner to that described herein. The first coolant chamber portion 826A is trapezoidal in shape and includes a pair of opposing upper cavity sidewalls 852A, 854A and a base surface 809.

The opposing upper cavity sidewalls 852A, 854A form a pair of opposing upper cavity sidewalls 852A, 854A which extend downwardly from the base surface 809 of the top portion 864 to the backside of the semiconductor device 804. The second coolant chamber portion 826B is formed on the backside 820 of the semiconductor device 804 in a similar manner to that described herein. In embodiments illustrated by FIG. 8, the second coolant chamber portion 826B is formed by patterning the backside 820 of the semiconductor device 804 and etching the second coolant chamber portion 826B into the backside of the semiconductor device 804. The second coolant chamber portion 826B is also trapezoidal in shape and includes a pair of opposing lower cavity sidewalls 852B, 854B. Similarly to the upper cavity sidewalls 852A, 852B, each pair of opposing lower cavity sidewalls 852B, 852B extend upwardly from the backside of the semiconductor device 804 towards the base surface 809 of the top portion 864 of the cold plate 806.

Each pair of opposing lower cavity sidewalls 852B, 854B is substantially aligned with a corresponding pair of opposing upper cavity sidewalls 854A, 854B in a direction parallel to the backside of the semiconductor device 804 so as to define the coolant chamber volume 826 therebetween.

In some embodiments, the first coolant chamber portion 826A extends away from the bottom portion 864 of the cold plate towards the top portion 862 of the cold plate 806. In some embodiments, the second coolant chamber portion 826B extends away from the backside 820 of the semiconductor device 804 towards the active side of the semiconductor device 804.

The cold plate 806 is attached to the backside 820 of the semiconductor device 804 without the use of an intervening adhesive material as described earlier herein such that the cold plate 806 and the backside 820 of the device 804 are in direct contact.

In the embodiment shown in FIG. 8, the coolant chamber volume 826 has a polygonal shape, and in the embodiment shown in FIG. 8, the coolant chamber 826 has six sides and has a hexagonal cross-section defined by the respective upper and lower cavity sidewalls 852A, 854A, 852B, 854B, the base surface 809 and the backside 820 of the semiconductor device 804. In some embodiments, the coolant chamber 826 may have more than six sides. In some embodiments, the coolant chamber may have fewer than six sides.

As shown in FIG. 8, hexagonal coolant chamber volumes 826 which are formed in accordance with the description below and with particular reference to FIG. 8 have a liquid angle 888 β which is less than 90 degrees. That is, a liquid angle of less than 90 degrees is formed between either upper cavity sidewall 852A, 854A and a plane defined by the backside 820 of the semiconductor device 804 before etching of the backside 820 has occurred. A liquid angle 888 which is less than 90 degrees may be considered a sharp corner which may give rise to a cooling dead zone or dead zones in the coolant chamber volume 826.

A liquid angle 889 γ which is larger than 90 degrees is also shown in FIG. 8. This liquid angle 889 is formed between an etched surface of the backside of semiconductor device 804 and either upper cavity sidewall 852A, 854A. Liquid angle 889 γ is greater than 90 degrees. Advantageously, a cold plate defining such an angle may mitigate the presence of a cooling dead zone or dead zones in the coolant chamber volume 826.

In some embodiments, the upper and lower cavity sidewalls 852A, 854A, 852B, 854B comprise first upper and lower cavity sidewalls 852A, 852B and second upper and lower cavity sidewalls 854A, 854B. In some embodiments, the angle defined between respective first upper and lower cavity sidewalls 852A, 852B is the liquid angle 889 γ and is greater than 90 degrees. In some embodiments, the angle defined between respective second upper and lower cavity sidewalls 854A, 854B is greater than 90 degrees.

The portion of the cooling assembly 803 shown in FIG. 8 may be used as part of a cooling assembly with the coolant chamber volume 826 being one of a plurality of coolant chamber volumes 826 to cool a semiconductor device 804. The resultant cooling assembly may, in some embodiments, form a part of a device package as described herein. In a similar way to that described herein, the coolant chamber volumes 826 may be spaced apart from one another at a spacing which is approximately equal to the width of the coolant chamber volume 826. In a similar way to that described herein, the coolant chamber volumes 826 may be spaced apart from one another at a spacing which is approximately equal to the width of the coolant chamber volume 826. As described herein, a distance between each pair of opposing upper cavity sidewalls 862A, 854A in a direction parallel with the backside 820 of the semiconductor device 804 defines a width W of a corresponding coolant chamber volume 826 and a spacing S between adjacent coolant chamber volumes 826, wherein the ratio of W to S is about 1:1.

Figure 9:
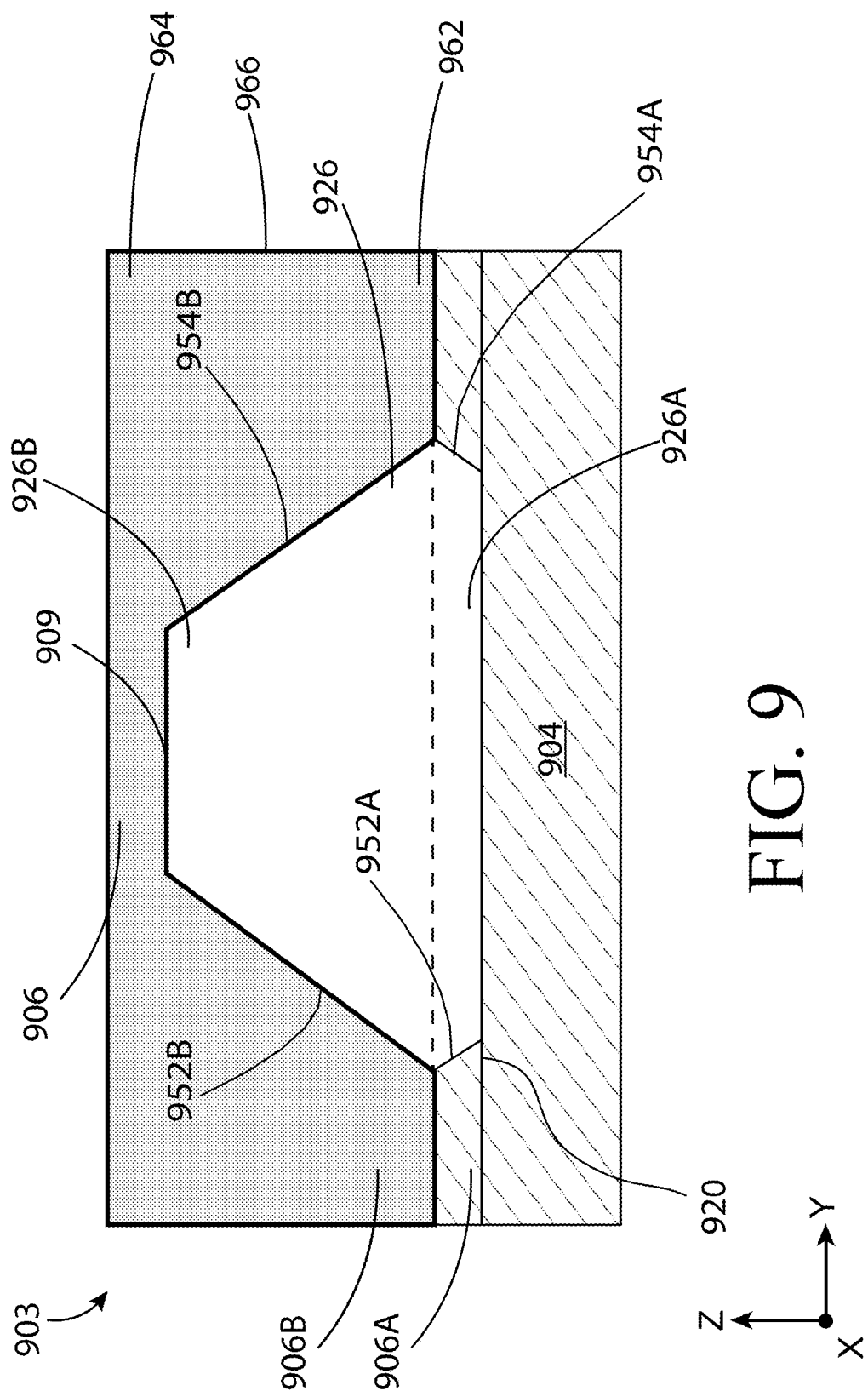
FIG. 9 is a partial schematic view of a cooling assembly having a cold plate and a semiconductor device, in accordance with one or more embodiments.

FIG. 9 is a schematic sectional view in the Y-Z plane of an example integrated cooling assembly 803, in accordance with embodiments of the disclosure. FIG. 9 shows another portion of a cooling assembly 903 which includes a cold plate 906 formed of a first substrate 906A and a second substrate 906B disposed vertically above the first substrate 906A. The first substrate 906A and the second substrate 906B are bonded together to form the cold plate 906. In some embodiments, the second substrate 906A is an intermediate substrate 906A disposed between the cold plate 906 and the semiconductor device 904. In some embodiments, the pair of opposing lower cavity sidewalls pass through the intermediate substrate and extend between the backside of the semiconductor device and the cold plate.

Similar to that described in connection with FIG. 8, the coolant chamber volume 926 is formed of a first coolant chamber portion 926A and a second coolant chamber portion 926B which combine to form the coolant chamber volume 926. The first coolant chamber volume is defined by a pair of opposing upper cavity sidewalls 952A, 954A and a base surface 909. Prior to bonding the first substrate 906A to the second substrate 906B, the first substrate 906A undergoes a patterning and etching process to create a first pair of opposing upper cavity sidewalls 952A, 954A. The cold plate 906 includes a top portion 964 and a bottom portion 962. The cold plate 906 includes a sidewall 966 which defines the perimeter of the cold plate 906. The sidewall 966, in some embodiments, is the outer wall of the cold plate 906, and may be referred to as a perimeter sidewall 966.

Similarly to the first substrate 906A, the second substrate 906B undergoes a patterning and etching process to create a second pair of opposing upper cavity sidewalls 952B, 954B. As can be seen in FIG. 9, the second coolant chamber portion 926B extends entirely through the second substrate 906B. In some embodiments, the second coolant chamber portion 926B extend only partially through the second substrate 906B. Portions of the first substrate 906A and the second substrate 906B around the etched surfaces are bonded together to form the cold plate 906. As described herein, the cold plate 906 is attached to the backside 920 of the semiconductor device 904 without the use of an intervening adhesive material as described earlier herein such that the cold plate 906 and the backside 920 of the device 904 are in direct contact. In a similar way to that described above, the coolant chamber volume 926 may be proximate to the backside 920 of the semiconductor device 804 to facilitate thermal dissipation. As shown in FIG. 9, the backside of the semiconductor device 904 forms a wall of the coolant chamber volume 926.

As with cooling assembly 803 described above, the portion of the cooling assembly 903 shown in FIG. 9 may be used as part of a cooling assembly with the coolant chamber volume 926 being one of a plurality of coolant chamber volumes 926 to cool a semiconductor device 904. The resultant cooling assembly may, in some embodiments, form a part of a device package as described herein. In a similar way to that described herein, the coolant chamber volumes 926 may be spaced apart from one another at a spacing which is approximately equal to the width of the coolant chamber volume 926. As described herein, a distance between each pair of opposing upper cavity sidewalls 962A, 954A in a direction parallel with the backside 920 of the semiconductor device 904 defines a width W of a corresponding coolant chamber volume 926 and a spacing S between adjacent coolant chamber volumes 926, wherein the ratio of W to S is about 1:1.

Figure 10:
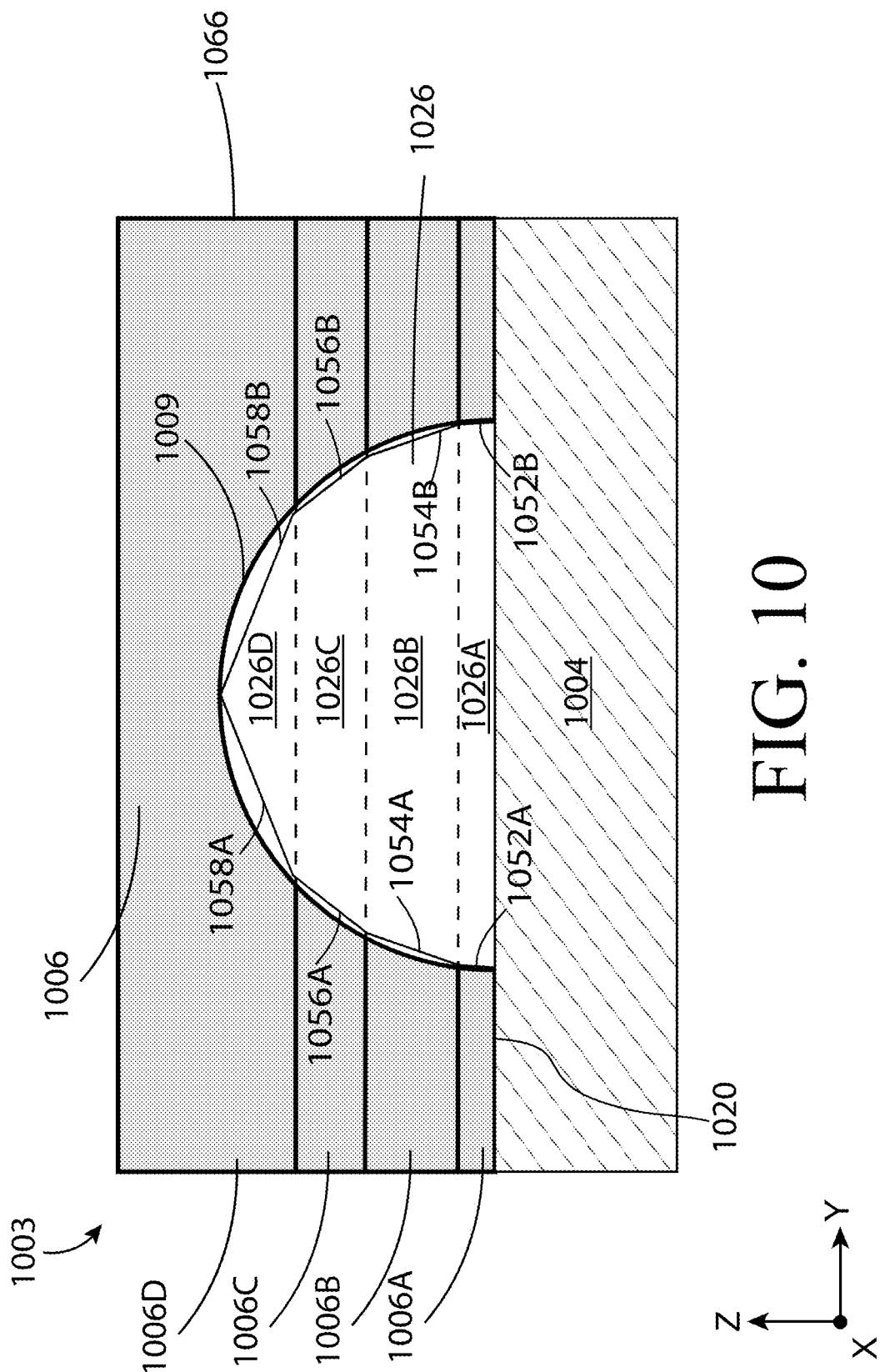
FIG. 10 is a partial schematic view of a cooling assembly having a cold plate and a semiconductor device, in accordance with one or more embodiments.

FIG. 10 is a schematic sectional view in the Y-Z plane of an example integrated cooling assembly 803, in accordance with embodiments of the disclosure. FIG. 10 shows a portion of a cooling assembly 1003 which includes a cold plate 1006 formed of a first substrate 1006A, a second substrate 1006B, a third substrate 1006C, and a fourth substrate 1006D (e.g., a plurality of intermediate substrates). The first substrate 1006A, the second substrate 1006B, the third substrate 1006C, and the fourth substrate 1006D are bonded together to form the cold plate 1006. In some embodiments, the first substrate 1006A, second substrate 1006B, and third substrate 1006C are intermediate substrates 1006A, 1006B, 1006C. In some embodiments, the intermediate substrates are to be stacked vertically between the cold plate 1006 and the semiconductor device 1004. In some embodiments, the intermediate substrates 1006A, 1006B, 1006C are stacked between the fourth substrate 1006D and the semiconductor device 1004, with the intermediate substrates 1006A, 1006B, 1006C and the fourth substrate 1006D forming the cold plate 1006. The cold plate 1006 includes a sidewall 1066 which defines the perimeter of the cold plate 1006. The sidewall 1066, in some embodiments, is the outer wall of the cold plate 1006, and may be referred to as a perimeter sidewall 1066.

As can be seen from FIG. 10 and in a similar way to that shown in FIGS. 8 and 9, the coolant chamber volume 1026 is formed of a first coolant chamber portion 1026A formed in the first substrate 1006A, a second coolant chamber portion 1026B formed in the second substrate 1006B, a third coolant chamber portion 1026C formed in the third substrate 1006C, and a fourth coolant chamber portion 1026D formed in the fourth substrate 1006D, which combine in a similar way to that described above to form a coolant chamber volume 1026.

In a similar way to that described in connection with FIG. 9, prior to bonding the first, second, third, and fourth substrate 1006A-D together, the first, second, and third substrates 1006A-1006C undergo a patterning and etching process to create cavity sidewalls 1052A-1052C and 1054A-1054C which pass through the first, second, and third substrates 1006A-C respectively and give rise to the first, second, and third coolant chamber portions 1026A-C.

Similar to FIG. 9, the fourth substrate 1006D undergoes an etching process to create cavity sidewalls 1058A and 1058B to create the fourth coolant chamber portion 1026D. As can be seen in FIG. 10, the fourth coolant chamber portion 1026D extends entirely through the fourth substrate 1006D, thus giving rise to the fourth coolant chamber portion 1026D. In some embodiments, the fourth coolant chamber portion 1006D extend only partially through the fourth substrate 1006A. After the etching of each of the first to fourth substrates 1006A-D, the first to fourth substrates 1006A-D are bonded together to form the cold plate 1006.

The first, second, third, and fourth coolant chamber portions 1026A-D each comprise respective first, second, third, and fourth opposing cavity sidewalls. The first coolant chamber portion 1026A includes respective first opposing cavity sidewalls 1052A and 1052B. The second coolant chamber portion 1026B includes respective second opposing cavity sidewalls 1054A and 1054B. The third coolant chamber portion 1026C includes respective third opposing cavity sidewalls 1056A and 1056B. The fourth coolant chamber portion 1026D includes respective fourth opposing cavity sidewalls 1058A and 1058B.

Each of the pairs of opposing cavity sidewalls 1052A, 1052B, 1054A, 1054B, 1056A, 1056B, 1058A, and 1058B define an angle with respect to the backside 1020 of the semiconductor device 1004. The first pair of opposing cavity sidewalls 1052A, 1052B define an angle of approximately 90 degrees with respect to the backside 1020 of the semiconductor device 1004, which is to say that the first pair of opposing cavity sidewalls 1052A, 1052B are approximately perpendicular to the backside 1020 of the semiconductor device 1004. In some embodiments, first opposing cavity sidewall 1052A is parallel with second opposing cavity sidewall 1052B.

The second pair of opposing cavity sidewalls 1054A, 1054B are angled toward each other, such that second opposing cavity sidewall 1054A points toward second opposing cavity sidewall 1054B, and the angle defined by the second opposing cavity sidewalls 1054A, 1054B with respect to the backside 1020 of the semiconductor device 1004 is less than 90 degrees and is more acute than the angle defined by the first pair of opposing cavity sidewalls 1052A, 1052B.

The third pair of opposing cavity sidewalls 1056A, 1056B are angled toward each other, such that third opposing cavity sidewall 1056A points toward third opposing cavity sidewall 1056B, and the angle defined by the third opposing cavity sidewalls 1056A, 1056B with respect to the backside 1020 of the semiconductor device 1004 is less than 90 degrees and is more acute than the angle defined by the second pair of opposing cavity sidewalls 1054A, 1054B.

The fourth pair of opposing cavity sidewalls 1054A, 1054B are angled toward each other and join together, such that fourth opposing cavity sidewall 1058A points toward, and connects with, fourth opposing cavity sidewall 1058B, and the angle defined by the fourth opposing cavity sidewalls 1058A, 1058B with respect to the backside 1020 of the semiconductor device 1004 is less than 90 degrees and is even more acute than the angle defined by the third pair of opposing cavity sidewalls 1056A, 1056B.

It can therefore be said that each respective pair of opposing cavity sidewalls 1052A, 1052B, 1054A, 1054B, 1056A, 1056B, 1058A, and 1058B defines a more acute angle as the opposing cavity sidewalls 1052A, 1052B, 1054A, 1054B, 1056A, 1056B, 1058A, and 1058B move away from the backside 1020 of the semiconductor device 1004 in the Z-axis direction.

In some embodiments, there are more than four substrates 1006A, 1006B, 1006C, 1006D. In some embodiments, there are fewer than four substrates 1006A, 1006B, 1006C, 1006D.

The cavity sidewalls of the coolant chamber volume 1026 shown in FIG. 10 define a coolant chamber volume 1026 having a profile which takes an almost semi-circular shape, with a semicircular profile 1009 shown in FIG. 10 to illustrate the shape that the profile of the coolant chamber volume 1026 may take. In some embodiments, a greater number of substrates than four substrates 1006A, 1006B, 1006C, 1006D may be used so as to define a coolant chamber volume 1026 having a semi-circular shape.

Similarly to that described above in connection with FIG. 8, the angle defined between the first pair of opposing cavity sidewalls 1052A, 1052B and the backside 1020 of the semiconductor device 1004 is not shallower than 90 degrees. This angle may give rise to improved cooling performance and the reduction of a dead zone or dead zones in the coolant chamber volume 1026.

The cold plate 1006 is attached to the backside 1020 of the semiconductor device 1004 without the use of an intervening adhesive material as described earlier herein such that the cold plate 1006 and the backside 1020 of the device 1004 are in direct thermal contact. In a similar way to that described above, the coolant chamber volume 1026 may be proximate to the backside 1020 of the semiconductor device 1004 to facilitate thermal dissipation. As shown in FIG. 10, the backside of the semiconductor device 1004 forms a wall of the coolant chamber volume 1026.

In a similar way to that described herein, the coolant chamber volumes 1026 may be spaced apart from one another at a spacing which is approximately equal to the width of the coolant chamber volume 1026. In a similar way to that described herein, the coolant chamber volumes 1026 may be spaced apart from one another at a spacing which is approximately equal to the width of the coolant chamber volume 1026. As described herein, a distance between each pair of opposing upper cavity sidewalls 1026A, 1054A in a direction parallel with the backside 1020 of the semiconductor device 1004 defines a width W of a corresponding coolant chamber volume 1026 and a spacing S between adjacent coolant chamber volumes 1026, wherein the ratio of W to S is about 1:1.

Figure 11:
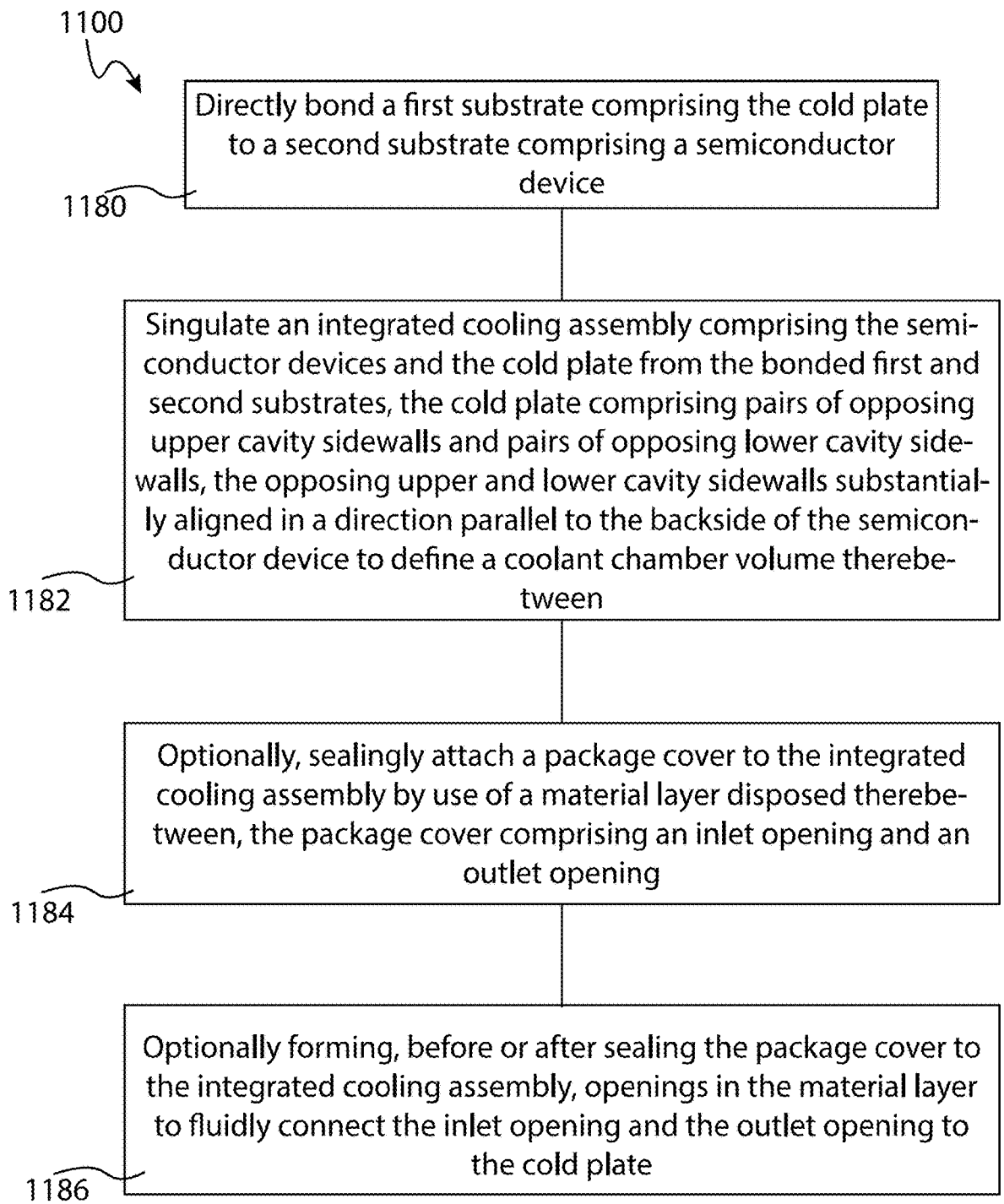
FIG. 11 shows a method that can be used to manufacture the integrated cooling assemblies described herein.

FIG. 11 is a flow diagram setting forth a method 1100 of forming an integrated cooling assembly, according to embodiments of the disclosure.

At block 1180, the method 1100 includes directly bonding a first substrate (e.g., a monocrystalline silicon wafer) comprising the cold plate 806, 906 to a second substrate (e.g., a monocrystalline silicon wafer) comprising a semiconductor device (e.g., semiconductor device 804, 904). For example, the first and second substrates may be etched using an anisotropic etch process as described above in connection with method 700 shown in FIG. 7, to form the cavity sidewalls 852A, 852B, 854A, 854B, 952A, 952B, 954A, 954B, and thus the coolant chamber 826, 926 shown in FIGS. 8 and 9.

At block 1182, the method 1100 includes singulating an integrated cooling assembly 803, 903, comprising the semiconductor device 804, 904 and the cold plate 806, 906 from the bonded first and second substrates.

At block 1184, the method 1100 comprises sealingly attaching a package cover to the integrated cooling assembly by use of a material layer disposed therebetween, where the package cover comprising an inlet opening and an outlet opening.

At block 1186, the method 1100 comprises before or after sealing the package cover 208 to the integrated cooling assembly 803, 903 forming openings in the material layer to fluidly connect the inlet opening and the outlet opening to the cold plate.

Figure 12:
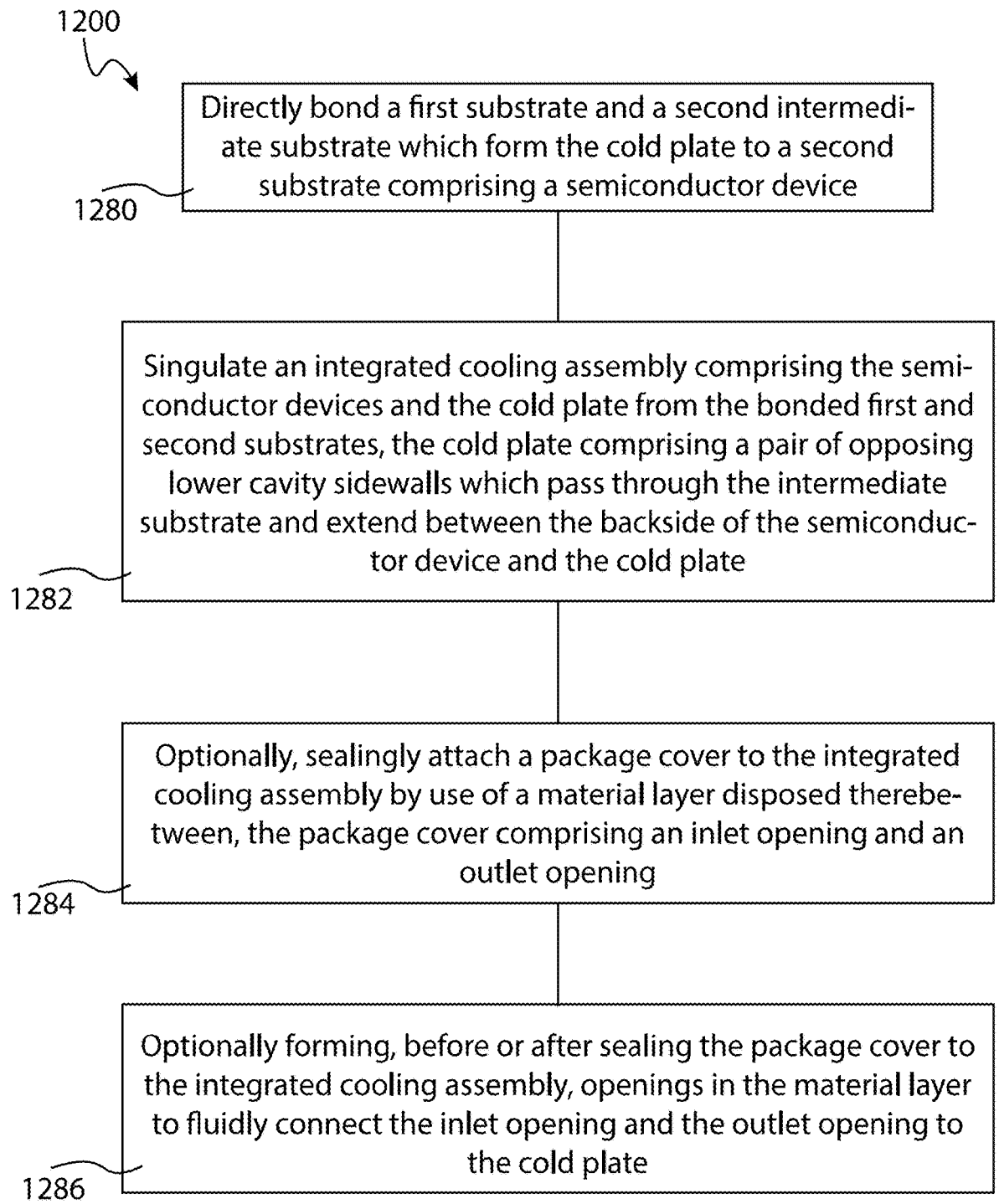
FIG. 12 shows a method that can be used to manufacture the integrated cooling assemblies described herein.

FIG. 12 is a flow diagram setting forth a method 1200 of forming an integrated cooling assembly, according to embodiments of the disclosure.

At block 1280, the method 1200 includes directly bonding a first substrate 906B (e.g., a monocrystalline silicon wafer) and a second, intermediate substrate (e.g., a monocrystalline silicon wafer) 906A to form a cold plate 906 to a third substrate (e.g., a monocrystalline silicon wafer) comprising a semiconductor device (e.g., semiconductor device 904). For example, the first and second substrates may be etched using an anisotropic etch process as described herein in connection with method 700 shown in FIG. 7, to form the cavity sidewalls 952A, 952B, 954A, 954B, and thus the coolant chamber 926 shown in FIG. 9.

At block 1282, the method 1200 includes singulating an integrated cooling assembly 903 comprising the semiconductor device 904 and the cold plate 906 from the bonded first, second, and third substrates.

At block 1284, the method 1200 comprises sealingly attaching a package cover to the integrated cooling assembly 903 by use of a material layer disposed therebetween, where the package cover comprising an inlet opening and an outlet opening.

At block 1286, the method 1200 comprises before or after sealing the package cover 208 to the integrated cooling assembly 903, forming openings in the material layer to fluidly connect the inlet opening and the outlet opening to the cold plate.

Figure 13:
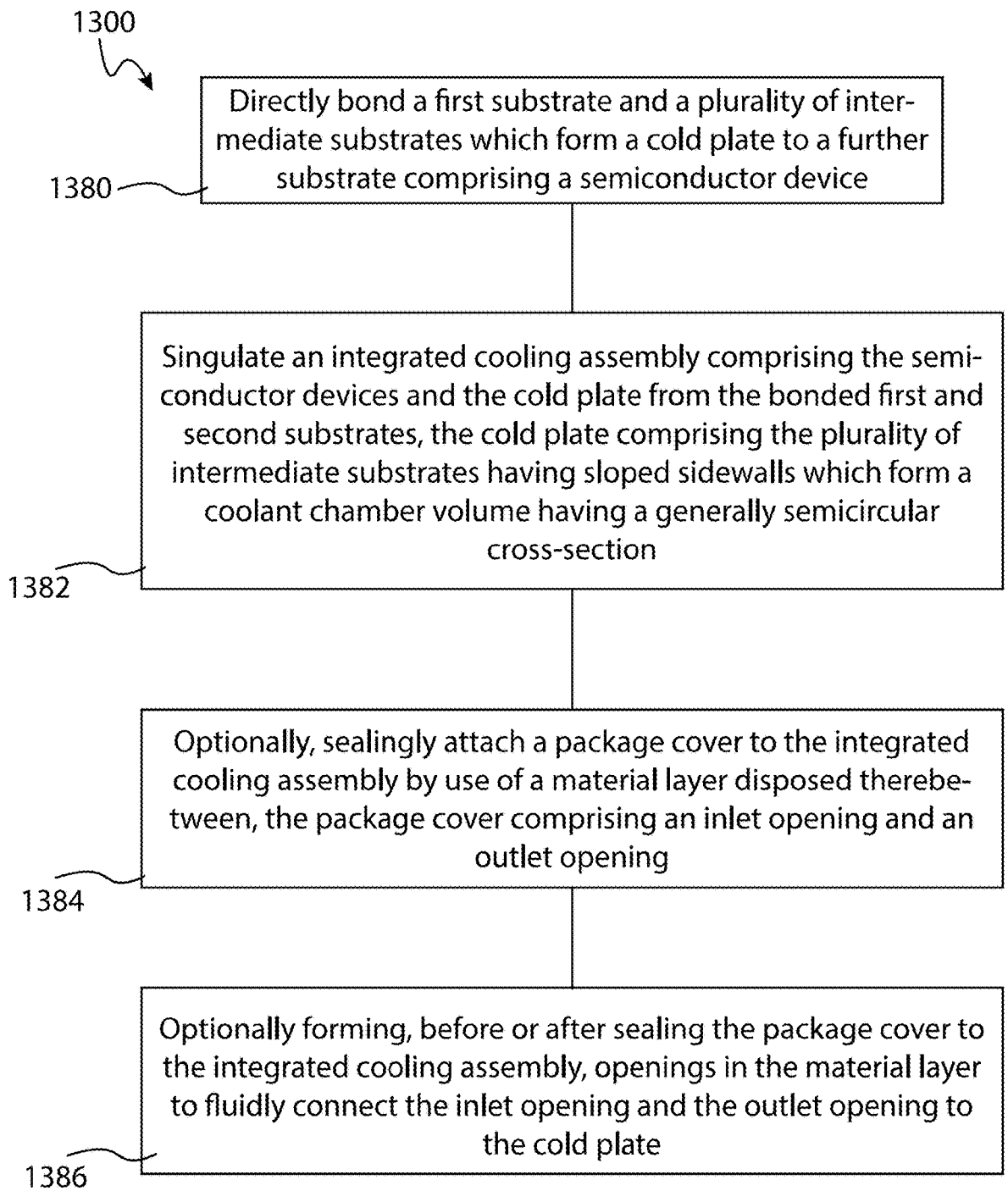
FIG. 13 shows a method that can be used to manufacture the integrated cooling assemblies described herein.

FIG. 13 is a flow diagram setting forth a method 1300 of forming an integrated cooling assembly, according to embodiments of the disclosure.

At block 1380, the method 1200 includes directly bonding a first substrate (e.g., a monocrystalline silicon wafer) to a plurality of intermediate substrates comprising second, third, and fourth substrates (1026A, 1026B, 1026C) to form a cold plate (1006) to a fifth substrate (e.g., a monocrystalline silicon wafer) comprising a semiconductor device (e.g., semiconductor device 1004). For example, the first, second, third, and fourth substrates may be etched using a plasma etch process to enable the angles of each respective pair of opposing cavity sidewalls 1052A, 1052B, 1054A, 1054B, 1056A, 1056B, 1058A, and 1058B to be varied. The plasma etch process may be a plasma anisotropic etching process. The plasma etching process may be controlled so as to vary the angles of each respective pair of opposing cavity sidewalls 1052A, 1052B, 1054A, 1054B, 1056A, 1056B, 1058A, and 1058B.

The patterned mask layer used during the plasma etching process may be formed using techniques described herein. In some examples, the plasma etching process may be fluorocarbon-based.

In another example, the first and second substrates may be etched using an anisotropic etch process as described herein, with the etch carried out with different etchants and controlled to enable the angles of each respective pair of opposing cavity sidewalls 1052A, 1052B, 1054A, 1054B, 1056A, 1056B, 1058A, and 1058B to be varied.

At block 1382, the method 1300 includes singulating an integrated cooling assembly 1003 comprising the semiconductor device 1004 and the cold plate 1006 from the bonded first and second substrates.

At block 1384, the method 1300 comprises sealingly attaching a package cover to the integrated cooling assembly by use of a material layer disposed therebetween, where the package cover comprising an inlet opening and an outlet opening.

At block 1386, the method 1300 comprises before or after sealing the package cover 208 to the integrated cooling assembly 1003, forming openings in the material layer to fluidly connect the inlet opening and the outlet opening to the cold plate.

The methods described above advantageously provides for integrated cooling assemblies that include cooling channel arrangements which increase cooling to semiconductor devices within a device package.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure.

What is claimed is:

1. A device package comprising:
   an integrated cooling assembly comprising a semiconductor device and a cold plate attached to the semiconductor device, the cold plate comprises:
   a perimeter sidewall;
   a top portion;
   a bottom portion, wherein the bottom portion of the cold plate is attached to the semiconductor device by direct dielectric bonds; and
   a plurality of pairs of opposing cavity sidewalls, wherein:
   the perimeter sidewall extends downwardly from the top portion to a backside of the semiconductor device to define a perimeter of the cold plate;
   a first pair of opposing cavity sidewalls extends downwardly from the top portion towards the backside of the semiconductor device to define a first coolant channel therebetween;
   a device-facing side of the first coolant channel is open to the backside of the semiconductor device;
   the first coolant channel has a substantially triangular cross-section defined by the first pair of opposing cavity sidewalls and the device-facing side of the first coolant channel;
   the first pair of opposing cavity sidewalls are joined together to define a first vertex of the substantially triangular cross-section, the first vertex being spaced from the backside of the semiconductor device,
   the substantially triangular cross-section has a pair of device-adjacent vertices at the backside of the semiconductor device, the pair of device-adjacent vertices comprise a first device-adjacent vertex and a second device-adjacent vertex;
   a distance between the first device-adjacent vertex and the second device-adjacent vertex along the backside of the semiconductor device defines a width W of the first coolant channel;
   the pair of device-adjacent vertices of the first coolant channel are separated from an additional pair of device-adjacent vertices of an adjacent coolant channel by a spacing S; and
   a ratio of W to S is substantially 1:1.

2. The device package of claim 1, wherein the ratio of W to S is between substantially 1:1.05 and 1:1.2.

3. The device package of claim 1, wherein each pair of opposing cavity sidewalls extend downwardly from the top portion to a depth of substantially 0.5 mm.

4. The device package of claim 1, wherein dividers are defined between adjacent coolant channels.

5. The device package of claim 1, wherein a portion of the cold plate is disposed above a hotspot region of the semiconductor device.

6. The device package of claim 5, wherein the portion of the cold plate disposed above the hotspot region of the semiconductor device is between adjacent coolant channels.

7. The device package of claim 5, wherein each pair of opposing cavity sidewalls are spaced apart in a direction parallel with the backside of the semiconductor device such that the portion of the cold plate disposed above the hotspot region is spaced evenly between adjacent coolant channels.

8. The device package of claim 1, wherein the cold plate comprises an inlet opening and an outlet opening disposed in the top portion, wherein the inlet opening and the outlet opening are in fluid communication with the first coolant channel.

9. The device package of claim 8, wherein each pair of opposing cavity sidewalls extends laterally and in parallel between the inlet opening and the outlet opening of the cold plate.

10. The device package of claim 1, further comprising:
    a package substrate upon which the integrated cooling assembly is disposed;
    a package cover extending over the integrated cooling assembly so that the integrated cooling assembly is disposed between the package substrate and the package cover, wherein:
    the package cover comprises an inlet opening and an outlet opening disposed therethrough; and
    one or more coolant channels are in fluid communication with the inlet opening and the outlet opening.

11. The device package of claim 10, wherein the device package further comprises a sealing material layer that surrounds an interface between the semiconductor device and the package substrate.

12. The device package of claim 1, wherein the integrated cooling assembly comprises a plurality of semiconductor devices and the cold plate is attached to the plurality of semiconductor devices.

13. The device package of claim 1, wherein the perimeter sidewall is formed integrally with the top portion.

14. The device package of claim 1, wherein the plurality of pairs of opposing cavity sidewalls are formed integrally with the top portion.

15. A device package comprising:
    an integrated cooling assembly comprising a semiconductor device and a cold plate attached to the semiconductor device, the cold plate comprises:
    a perimeter sidewall;
    a top portion;
    a bottom portion, wherein the bottom portion of the cold plate is attached to the semiconductor device by direct hybrid bonds; and
    a plurality of pairs of opposing cavity sidewalls, wherein:
    the perimeter sidewall extends downwardly from the top portion to a backside of the semiconductor device to define a perimeter of the cold plate;
    a first pair of opposing cavity sidewalls extends downwardly from the top portion towards the backside of the semiconductor device to define a first coolant channel therebetween;

a device-facing side of the first coolant channel is open to the backside of the semiconductor device;

the first coolant channel has a substantially triangular cross-section defined by the first pair of opposing cavity sidewalls and the device-facing side of the first coolant channel;

the first pair of opposing cavity sidewalls are joined together to define a first vertex of the substantially triangular cross-section, the first vertex being spaced from the backside of the semiconductor device, the substantially triangular cross-section has a pair of device-adjacent vertices at the backside of the semiconductor device, the pair of device-adjacent vertices comprise a first device-adjacent vertex and a second device-adjacent vertex;

a distance between the first device-adjacent vertex and the second device-adjacent vertex along the backside of the semiconductor device defines a width W of the first coolant channel;

the pair of device-adjacent vertices of the first coolant channel are separated from an additional pair of device-adjacent vertices of an adjacent coolant channel by a spacing S; and a ratio of W to S is substantially 1:1.

16. The device package of claim 15, wherein the ratio of W to S is between substantially 1:1.05 and 1:1.2.

17. The device package of claim 15, wherein a portion of the cold plate is disposed above a hotspot region of the semiconductor device.

18. The device package of claim 17, wherein the portion of the cold plate disposed above the hotspot region of the semiconductor device is between adjacent coolant channels.

19. The device package of claim 17, wherein each pair of opposing cavity sidewalls are spaced apart in a direction parallel with the backside of the semiconductor device such that the portion of the cold plate disposed above the hotspot region is spaced evenly between adjacent coolant channels.

20. The device package of claim 15, wherein the integrated cooling assembly comprises a plurality of semiconductor devices and the cold plate is attached to the plurality of semiconductor devices.

* * * * *